United States Patent
Spurlin et al.

(10) Patent No.: US 9,865,501 B2
(45) Date of Patent: Jan. 9, 2018

(54) METHOD AND APPARATUS FOR REMOTE PLASMA TREATMENT FOR REDUCING METAL OXIDES ON A METAL SEED LAYER

(71) Applicant: Lam Research Corporation, Fremont, CA (US)

(72) Inventors: Tighe A. Spurlin, Portland, OR (US); George Andrew Antonelli, Portland, OR (US); Natalia Doubina, Portland, OR (US); James E. Duncan, Beaverton, OR (US); Jonathan D. Reid, Sherwood, OR (US); David Porter, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/086,770

(22) Filed: Nov. 21, 2013

(65) Prior Publication Data

US 2014/0256128 A1   Sep. 11, 2014

Related U.S. Application Data

(63) Continuation-in-part of application No. 13/787,499, filed on Mar. 6, 2013, and a continuation-in-part of application No. 14/020,339, filed on Sep. 6, 2013.

(51) Int. Cl.
*H01L 21/768* (2006.01)
*H01L 21/02* (2006.01)
(Continued)

(52) U.S. Cl.
CPC .... *H01L 21/76873* (2013.01); *C23C 18/1619* (2013.01); *C23C 18/1675* (2013.01);
(Continued)

(58) Field of Classification Search
CPC ................ H01L 21/76873–21/76874
See application file for complete search history.

(56) References Cited

U.S. PATENT DOCUMENTS

| | | | |
|---|---|---|---|
| 4,551,357 A | 11/1985 | Takeuchi | |
| 4,642,161 A | 2/1987 | Akahoshi et al. | |

(Continued)

FOREIGN PATENT DOCUMENTS

| | | |
|---|---|---|
| CN | 1639859 A | 7/2005 |
| CN | 101730929 A | 6/2010 |

(Continued)

OTHER PUBLICATIONS

U.S. Application titled, "Methods for Reducing Metal Oxide Surfaces to Modified Metal Surfaces," Spurlin et al., filed Jan. 14, 2013, U.S. Appl. No. 13/741,151.

(Continued)

*Primary Examiner* — Dah-Wei D. Yuan
*Assistant Examiner* — Stephen A Kitt
(74) *Attorney, Agent, or Firm* — Weaver Austin Villeneuve & Sampson LLP

(57) ABSTRACT

Method and apparatus for reducing metal oxide surfaces to modified metal surfaces are disclosed. By exposing a metal oxide surface to a remote plasma, the metal oxide surface on a substrate can be reduced to pure metal and the metal reflowed. A remote plasma apparatus can treat the metal oxide surface as well as cool, load/unload, and move the substrate within a single standalone apparatus. The remote plasma apparatus includes a processing chamber and a controller configured to provide a substrate having a metal seed layer in a processing chamber, form a remote plasma of a reducing gas species where the remote plasma includes radicals, ions, and/or ultraviolet (UV) radiation from the reducing gas species, and expose a metal seed layer of the (Continued)

substrate to the remote plasma to reduce oxide of the metal seed layer to metal and to reflow the metal.

19 Claims, 15 Drawing Sheets

(51) Int. Cl.
| | |
|---|---|
| H01L 21/67 | (2006.01) |
| H01L 21/687 | (2006.01) |
| C23C 18/18 | (2006.01) |
| C25D 5/34 | (2006.01) |
| C25D 5/40 | (2006.01) |
| C25D 5/42 | (2006.01) |
| C25D 17/00 | (2006.01) |
| C23C 18/16 | (2006.01) |
| H01J 37/32 | (2006.01) |

(52) U.S. Cl.
CPC ...... *C23C 18/1851* (2013.01); *C23C 18/1865* (2013.01); *C23C 18/1868* (2013.01); *C25D 5/34* (2013.01); *C25D 5/40* (2013.01); *C25D 5/42* (2013.01); *C25D 17/001* (2013.01); *H01J 37/32357* (2013.01); *H01L 21/02063* (2013.01); *H01L 21/02068* (2013.01); *H01L 21/67115* (2013.01); *H01L 21/68742* (2013.01); *H01L 21/76861* (2013.01); *H01L 21/76874* (2013.01)

(56) References Cited

U.S. PATENT DOCUMENTS

| | | |
|---|---|---|
| 4,902,551 A | 2/1990 | Nakaso et al. |
| 4,904,621 A | 2/1990 | Loewenstein et al. |
| 5,252,196 A | 10/1993 | Sonnenberg et al. |
| 5,472,563 A | 12/1995 | Kagawa et al. |
| 6,056,850 A * | 5/2000 | Blalock et al. .......... 156/345.27 |
| 6,086,956 A | 7/2000 | Fakler et al. |
| 6,123,775 A * | 9/2000 | Hao .................. C23C 16/45572 118/715 |
| 6,126,798 A | 10/2000 | Reid et al. |
| 6,156,167 A | 12/2000 | Patton et al. |
| 6,197,181 B1 | 3/2001 | Chen |
| 6,204,192 B1 | 3/2001 | Zhao et al. |
| 6,232,230 B1 | 5/2001 | Iacoponi |
| 6,255,217 B1 | 7/2001 | Agnello et al. |
| 6,319,384 B1 | 11/2001 | Taylor et al. |
| 6,352,938 B2 | 3/2002 | Chen et al. |
| 6,432,821 B1 | 8/2002 | Dubin et al. |
| 6,440,291 B1 | 8/2002 | Henri et al. |
| 6,464,779 B1 | 10/2002 | Powell et al. |
| 6,569,299 B1 | 5/2003 | Reid et al. |
| 6,573,607 B2 | 6/2003 | Ito et al. |
| 6,602,653 B1 | 8/2003 | Geusic et al. |
| 6,610,192 B1 | 8/2003 | Step et al. |
| 6,638,411 B1 | 10/2003 | Mishima et al. |
| 6,664,122 B1 | 12/2003 | Andryuschenko et al. |
| 6,680,540 B2 | 1/2004 | Nakano et al. |
| 6,699,380 B1 | 3/2004 | Chen et al. |
| 6,709,523 B1 | 3/2004 | Toshima et al. |
| 6,720,204 B2 | 4/2004 | Sudijono et al. |
| 6,734,102 B2 | 5/2004 | Rathi et al. |
| 6,743,719 B1 | 6/2004 | Chen et al. |
| 6,764,952 B1 | 7/2004 | Yu et al. |
| 6,793,796 B2 | 9/2004 | Reid et al. |
| 6,800,187 B1 | 10/2004 | Reid et al. |
| 6,815,349 B1 | 11/2004 | Minshall et al. |
| 6,844,258 B1 | 1/2005 | Fair et al. |
| 6,849,122 B1 | 2/2005 | Fair |
| 6,902,605 B2 | 6/2005 | Kolics et al. |
| 6,946,401 B2 | 9/2005 | Huang et al. |
| 6,962,873 B1 | 11/2005 | Park |
| 7,232,513 B1 | 6/2007 | Webb et al. |
| 7,265,061 B1 | 9/2007 | Cho et al. |
| 7,327,948 B1 | 2/2008 | Shrinivasan et al. |
| 7,405,157 B1 | 7/2008 | Reid et al. |
| 7,442,267 B1 | 10/2008 | Webb et al. |
| 7,456,102 B1 | 11/2008 | Varadarajan et al. |
| 7,799,684 B1 | 9/2010 | Reid et al. |
| 7,851,232 B2 | 12/2010 | Van Schravendijk et al. |
| 7,874,218 B2 | 1/2011 | Izumi et al. |
| 7,879,218 B1 | 2/2011 | Webb et al. |
| 7,897,198 B1 | 3/2011 | Parks et al. |
| 7,941,039 B1 | 5/2011 | Shrinivasan et al. |
| 7,964,506 B1 | 6/2011 | Ponnuswamy et al. |
| 8,033,771 B1 | 10/2011 | Gage et al. |
| 8,043,958 B1 | 10/2011 | Reid et al. |
| 8,084,339 B2 | 12/2011 | Antonelli et al. |
| 8,084,399 B2 | 12/2011 | Yu et al. |
| 8,137,465 B1 | 3/2012 | Shrinivasan et al. |
| 8,137,467 B2 | 3/2012 | Meinhold et al. |
| 8,197,662 B1 | 6/2012 | Webb et al. |
| 8,217,513 B2 | 7/2012 | Antonelli et al. |
| 8,242,028 B1 | 8/2012 | Van Schravendijk et al. |
| 8,288,288 B1 | 10/2012 | Gage et al. |
| 8,371,567 B2 | 2/2013 | Angelov et al. |
| 8,372,754 B2 | 2/2013 | Hanson et al. |
| 9,070,750 B2 | 6/2015 | Spurlin et al. |
| 9,469,912 B2 | 10/2016 | Buckalew et al. |
| 9,472,377 B2 | 10/2016 | Opocensky et al. |
| 9,607,822 B2 | 3/2017 | Buckalew et al. |
| 2001/0013473 A1 | 8/2001 | Taylor |
| 2001/0014373 A1 | 8/2001 | Lin et al. |
| 2001/0015321 A1 | 8/2001 | Reid et al. |
| 2002/0008034 A1 | 1/2002 | Chen et al. |
| 2002/0195352 A1 | 12/2002 | Mayer et al. |
| 2003/0001271 A1 | 1/2003 | Uozumi |
| 2003/0017628 A1 | 1/2003 | Li et al. |
| 2003/0034251 A1 * | 2/2003 | Chikarmane ....... C23C 18/1632 205/125 |
| 2003/0036280 A1 | 2/2003 | Jain et al. |
| 2003/0051665 A1 | 3/2003 | Zhao et al. |
| 2003/0186524 A1 | 10/2003 | Ryo |
| 2003/0213561 A1 | 11/2003 | Selwyn et al. |
| 2004/0000488 A1 | 1/2004 | Yang |
| 2004/0050685 A1 | 3/2004 | Yara et al. |
| 2004/0084301 A1 | 5/2004 | Dordi et al. |
| 2004/0118697 A1 * | 6/2004 | Wen+ et al. .................. 205/215 |
| 2004/0142557 A1 | 7/2004 | Levy et al. |
| 2004/0200244 A1 * | 10/2004 | Hong et al. .................. 68/12.26 |
| 2004/0217009 A1 | 11/2004 | Mikkola et al. |
| 2004/0226827 A1 | 11/2004 | Dubin et al. |
| 2005/0020057 A1 | 1/2005 | Kudo et al. |
| 2005/0167404 A1 | 8/2005 | Yamazaki |
| 2005/0208754 A1 | 9/2005 | Kostamo et al. |
| 2006/0223310 A1 | 10/2006 | Suzuki |
| 2006/0278612 A1 | 12/2006 | Tokunaga et al. |
| 2006/0283716 A1 | 12/2006 | Hafezi et al. |
| 2007/0062818 A1 | 3/2007 | Daviot et al. |
| 2007/0292603 A1 | 12/2007 | Dordi et al. |
| 2008/0020593 A1 | 1/2008 | Wang et al. |
| 2008/0081464 A1 | 4/2008 | Matsuda et al. |
| 2008/0152822 A1 | 6/2008 | Vaskelis et al. |
| 2008/0213994 A1 | 9/2008 | Chebiam et al. |
| 2009/0095220 A1 | 4/2009 | Meinhold et al. |
| 2009/0181164 A1 | 7/2009 | Wang et al. |
| 2009/0277867 A1 | 11/2009 | Mayer et al. |
| 2010/0108491 A1 | 5/2010 | Yoon et al. |
| 2010/0200412 A1 | 8/2010 | Reid et al. |
| 2010/0317178 A1 * | 12/2010 | Antonelli et al. ............ 438/584 |
| 2010/0317198 A1 | 12/2010 | Antonelli et al. |
| 2010/0320081 A1 | 12/2010 | Mayer et al. |
| 2011/0146571 A1 | 6/2011 | Bartlett et al. |
| 2012/0211473 A1 * | 8/2012 | Goto ....................... C01B 3/00 219/121.59 |
| 2013/0171833 A1 | 7/2013 | Buckalew et al. |
| 2014/0199497 A1 | 7/2014 | Spurlin et al. |
| 2014/0256127 A1 | 9/2014 | Spurlin et al. |
| 2014/0256128 A1 | 9/2014 | Spurlin et al. |
| 2014/0357089 A1 | 12/2014 | Buckalew et al. |
| 2015/0072538 A1 | 3/2015 | Spurlin et al. |
| 2015/0218724 A1 | 8/2015 | Mevellec et al. |

(56) References Cited

U.S. PATENT DOCUMENTS

| | | |
|---|---|---|
| 2015/0299886 A1 | 10/2015 | Doubina et al. |
| 2015/0303065 A1 | 10/2015 | Buckalew et al. |
| 2015/0376792 A1 | 12/2015 | Spurlin et al. |
| 2016/0111342 A1 | 4/2016 | Huang et al. |
| 2016/0111344 A1 | 4/2016 | Opocensky et al. |
| 2017/0011906 A1 | 1/2017 | Buckalew et al. |

FOREIGN PATENT DOCUMENTS

| | | |
|---|---|---|
| CN | 102804338 A | 11/2012 |
| TW | 430867 B | 4/2001 |
| TW | 200305254 A | 10/2003 |
| TW | 589405 | 6/2004 |
| TW | 200931534 A | 7/2009 |
| WO | WO 2014/014907 | 1/2014 |
| WO | WO 2014/044942 | 3/2014 |

OTHER PUBLICATIONS

U.S. Patent Application titled, "Methods for Reducing Metal Oxide Surfaces to Modify Metal Surfaces Using a Gaseous Reducing Environment," filed Mar. 6, 2013, U.S. Appl. No. 13/787,499.
U.S. Application titled, "Deposit Morphology of Electroplated Copper After Selective Removal of Copper Oxides During Pretreatment," Webb et al., filed Jul. 11, 2012, U.S. Appl. No. 13/546,146.
U.S. Application titled, "Method for Improving the Nucleation and Morphology of Ruthenium Liners Deposited on Tantalum Nitride," Gopinath, et al., filed Sep. 29, 2006, U.S. Appl. No. 11/540,937.
U.S. Application titled, "Copper Electroplating Process for Uniform Across Wafer Deposition and Void Free Filling on Semi-Noble Metal Coated Wafers," Ponnuswamy et al., filed Sep. 29, 2006, U.S. Appl. No. 12/785,205.
U.S. Application titled, "Copper Electroplating Process for Uniform Across Wafer Deposition and Void Free Filling on Semi-Noble Metal Coated Wafers," Ponnuswamy et al., filed Feb. 7, 2012, U.S. Appl. No. 13/367,710.
U.S. Application titled, "Single-Chamber Sequential Curing of Semiconductor Wafers," Shrinivasan et al., filed Feb. 10, 2012, U.S. Appl. No. 13/370,579.
U.S. Application titled, "Cast Pedestal With Heating Element and Coaxial Heat Exchanger," Shrinivasan et al., filed May 21, 2007, U.S. Appl. No. 11/751,584.
U.S. Application titled, "Tailored Profile Pedestal for Thermo-Elastically Stable Cooling or Heating of Substrates," Landess et al., filed May 12, 2005, U.S. Appl. No. 11/129,266.
U.S. Application titled, "Tailored Profile Pedestal for Thermo-Elastically Stable Cooling or Heating of Substrates," Landess et al., filed Mar. 29, 2010, U.S. Appl. No. 12/749,170.
U.S. Application titled, "Concave Pedestal for Uniform Heating of Silicon Wafers," Doble et al., filed Oct. 10, 2006, U.S. Appl. No. 11/546,189.
U.S. Application titled, "Pedestal Covers," Angelov et al., filed Jan. 8, 2013, U.S. Appl. No. 13/736,410.
U.S. Application titled, "Minimum Contact Area Wafer Clamping With Gas Flow for Rapid Wafer Cooling," Gage et al., filed Sep. 7, 2011, U.S. Appl. No. 13/227,160.
U.S. Application titled, "Transferring Heat in Loadlocks," Gage et al., filed Sep. 15, 2012, U.S. Appl. No. 13/621,060.
U.S. Application titled, "Remote Plasma Processing of Interface Surfaces," Antonelli et al., filed Jul. 31, 2009, U.S. Appl. No. 12/533,960.
U.S. Office Action, dated Oct. 18, 2005, issued in U.S. Appl. No. 10/741,048.
U.S. Office Action, dated Mar. 6, 2006, issued in U.S. Appl. No. 10/741,048.
U.S. Office Action, dated Mar. 17, 2006, issued in U.S. Appl. No. 10/741,048.
U.S. Final Office Action, dated Jul. 18, 2006, issued in U.S. Appl. No. 10/741,048.
U.S. Office Action, dated Nov. 27, 2006, issued in U.S. Appl. No. 10/741,048.
U.S. Final Office Action, dated Apr. 24, 2007, issued in U.S. Appl. No. 10/741,048.
U.S. Office Action, dated Aug. 9, 2007, issued in U.S. Appl. No. 10/741,048.
U.S. Final Office Action, dated Dec. 14, 2007, issued in U.S. Appl. No. 10/741,048.
U.S. Notice of Allowance, dated Sep. 23, 2010, issued in U.S. Appl. No. 10/741,048.
U.S. Notice of Allowance, dated Feb. 23, 2012, issued in U.S. Appl. No. 12/971,367.
U.S. Office Action, dated May 1, 2013, issued in U.S. Appl. No. 13/493,933.
U.S. Patent Application titled, "Method and Apparatus for Remote Plasma Treatment for Reducing Metal Oxides on a Metal Seed Layer," filed Sep. 6, 2013, U.S. Appl. No. 14/020,339.
U.S. Patent Application titled, "Pretreatment Method for Photoresist Wafer Processing," filed Apr. 21, 2014, U.S. Appl. No. 14/257,744.
U.S. Patent Application titled, "Method and Apparatus for Preparing a Substrate with a Semi-Noble Metal Layer," filed Apr. 18, 2014, U.S. Appl. No. 14/256,671.
U.S. Patent Application titled, Atmospheric Plasma Apparatus for Semiconductor Processing, filed Jun. 30, 2014, U.S. Appl. No. 14/320,171.
U.S. Patent Application titled, "Improved Deposit Morphology of Electroplated Copper," filed Jun. 11, 2012, U.S. Appl. No. 13/493,933.
U.S. Application titled, "Apparatus for Advanced Packaging Applications," Buckalew et al., filed May 29, 2013, U.S. Appl. No. 13/904,283.
U.S. Office Action, dated Dec. 9, 2014, issued in U.S. Appl. No. 13/741,151.
U.S. Office Action, dated Jul. 18, 2014, issued in U.S. Appl. No. 13/787,499.
U.S. Notice of Allowance, dated Feb. 6, 2015, issued in U.S. Appl. No. 13/787,499.
U.S. Examiner's Answer Before the Board of Patent Appeals and Interferences, dated Jun. 18, 2008, issued in U.S. Appl. No. 10/741,048.
U.S. Examiner's Decision on Appeal Before the Board of Patent Appeals and Interferences, dated Sep. 17, 2010, issued in U.S. Appl. No. 10/741,048.
U.S. Patent Application titled, "Method and Apparatus for Characterizing Metal Oxide Reduction," filed Mar. 13, 2015, U.S. Appl. No. 14/657,956.
U.S. Office Action, dated May 6, 2015, issued in U.S. Appl. No. 14/020,339.
U.S. Patent Application titled, "Method and Apparatus for Characterizing Metal Oxide Reduction," filed Oct. 15, 2015, U.S. Appl. No. 14/884,504.
U.S. Office Action, dated Aug. 13, 2015, issued in U.S. Appl. No. 13/546,146.
Chavez et al., (2001) "A Novel Method of Etching Copper Oxide Using Acetic Acid" Journal of the Electrochemical Society,148(11):G640-G643.
U.S. Notiec of Allowance, dated Jun. 21, 2016, issued in U.S. Appl. No. 14/257,744.
U.S. Office Action, dated Feb. 5, 2016, issued in U.S. Appl. No. 14/256,671.
U.S. Final Office Action, dated May 19, 2016, issued in U.S. Appl. No. 14/256,671.
U.S. Office Action, dated Feb. 2, 2016, issued in U.S. Appl. No. 14/320,171.
U.S. Office Action dated Mar. 9, 2016, issued in U.S. Appl. No. 14/657,956.
U.S. Notice of Allowance dated Jun. 22, 2016, issued in U.S. Appl. No. 14/657,956.
U.S. Final Office Action, dated Feb. 26, 2016, issued in U.S. Appl. No. 13/546,146.
Chinese First Office Action, dated Apr. 1, 2016, issued in Application No. CN 201410080405.0.

(56) References Cited

OTHER PUBLICATIONS

U.S. Notice of Allowance, dated Nov. 23, 2016, issued in U.S. Appl. No. 15/264,262.
U.S. Office Action, dated Aug. 25, 2016, issued in U.S. Appl. No. 14/256,671.
U.S. Office Action dated Jan. 13, 2017, issued in U.S. Appl. No. 14/884,504.
Chinese Second Office Action, dated Dec. 5, 2016, issued in Application No. CN 201410080405.0.
Shivkumar et al., "Analysis of Hydrogen Plasma in a Microwave Plasma Chemical Vapor Deposition Reactor," *J. Applied Phys.*, vol. 119, pp. 1113301-1-13 (2016).
U.S. Final Office Action, dated Apr. 5, 2017, issued in U.S. Appl. No. 14/020,339.
U.S. Final Office Action dated May 23, 2017, issued in U.S. Appl. No. 14/884,504.
Chinese Third Office Action, dated Jun. 2, 2017, issued in Application No. CN 201410080405.0.
Taiwan Examination Report, dated Jun. 22, 2017, issued in Application No. TW 103107265.
Venkataraman, (Aug. 2007) "Electrodeposition of Copper on Ruthenium Oxides and Bimetallic Corrosion of Copper/Ruthenium in Polyphenolic Antioxidants," *Thesis Prepared for the Degree of Master of Science,* University of North Texas, 118 pages.
U.S. Appl. No. 15/475,022, filed Mar. 30, 2017, Huang et al.

\* cited by examiner

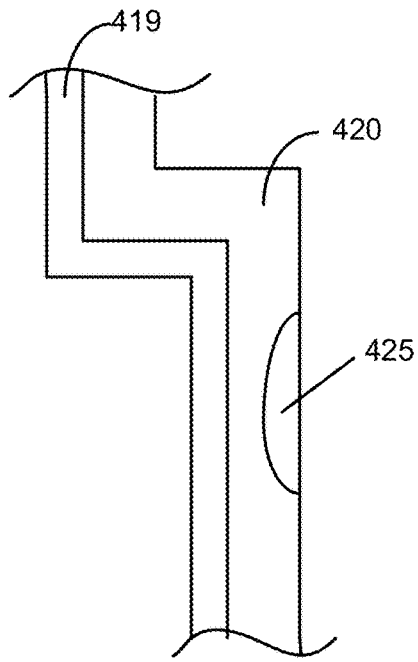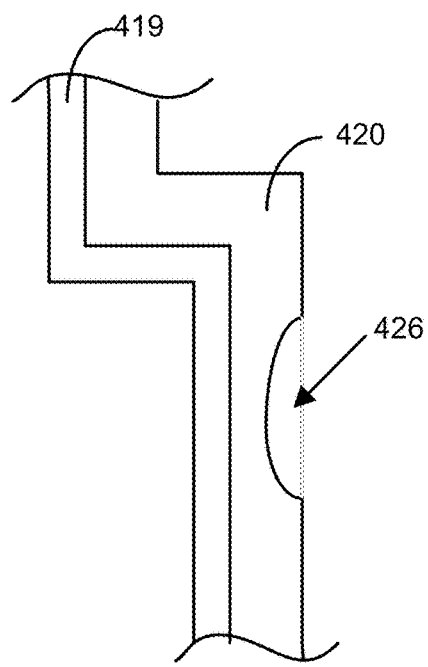
*FIG. 4A*  *FIG. 4B*
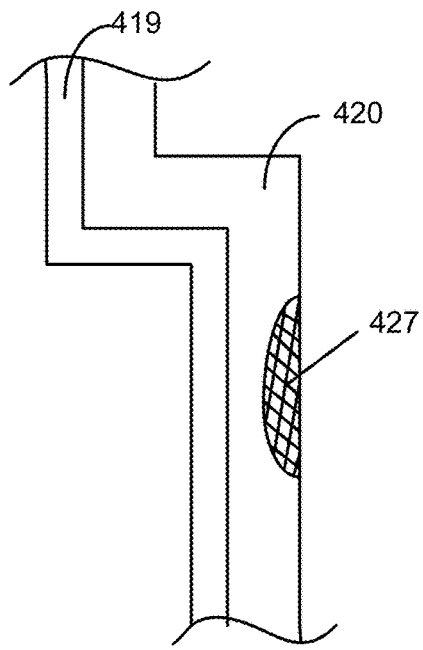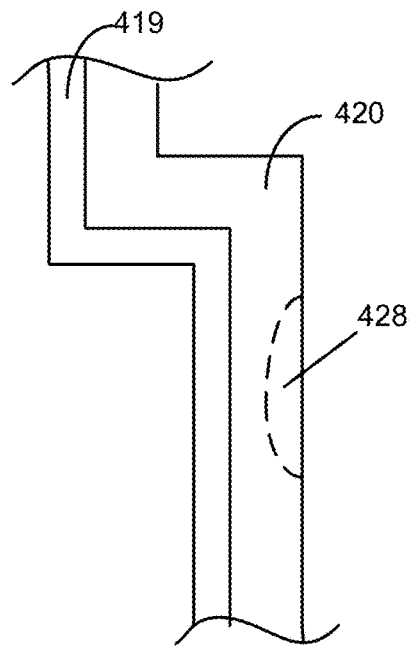
*FIG. 4C*  *FIG. 4D*

METHOD AND APPARATUS FOR REMOTE PLASMA TREATMENT FOR REDUCING METAL OXIDES ON A METAL SEED LAYER

CROSS-REFERENCE TO RELATED APPLICATIONS

This application is a continuation-in-part of U.S. patent application Ser. No. 13/787,499, titled "METHODS FOR REDUCING METAL OXIDE SURFACES TO MODIFIED METAL SURFACES USING A GASEOUS REDUCING ENVIRONMENT," filed Mar. 6, 2013, and is a continuation-in-part of U.S. patent application Ser. No. 14/020,339, titled "METHOD AND APPARATUS FOR REMOTE PLASMA TREATMENT FOR REDUCING METAL OXIDES ON A METAL SEED LAYER," filed Sep. 6, 2013, all of which are incorporated herein by reference for all purposes.

INTRODUCTION

Field of the Invention

This disclosure generally relates to reducing metal oxide surfaces on metal seed layers. Certain aspects of this disclosure pertain to reducing metal oxide surfaces on metal seed layers using a remote plasma apparatus.

Background

Formation of metal wiring interconnects in integrated circuits (ICs) can be achieved using a damascene or dual damascene process. Typically, trenches or holes are etched into dielectric material, such as silicon dioxide, located on a substrate. The holes or trenches may be lined with one or more adhesion and/or diffusion barrier layers. Then a thin layer of metal may be deposited in the holes or trenches that can act as a seed layer for electroplated metal. Thereafter, the holes or trenches may be filled with electroplated metal.

Typically, the seed metal is copper. However, other metals such as ruthenium, palladium, iridium, rhodium, osmium, cobalt, nickel, gold, silver, and aluminum, or alloys of these metals, may also be used.

To achieve higher performance ICs, many of the features of the ICs are being fabricated with smaller feature sizes and higher densities of components. In some damascene processing, for example, copper seed layers on 2x-nm node features may be as thin as or thinner than 50 Å. In some implementations, metal seed layers on 1x-nm node features may be applied that may or may not include copper. Technical challenges arise with smaller feature sizes in producing metal seed layers and metal interconnects substantially free of voids or defects.

SUMMARY

This disclosure pertains to a remote plasma apparatus for treating a substrate with a metal seed layer. The remote plasma apparatus can include a processing chamber, a substrate support for holding the substrate in the processing chamber, a remote plasma source over the substrate support, a showerhead between the remote plasma source and the substrate support, and one or more movable members configured to move the substrate between the showerhead and the substrate support in the processing chamber. The remote plasma apparatus further includes a controller with instructions to perform the operations of providing the substrate in the processing chamber, moving the substrate towards the substrate support in the processing chamber, forming a remote plasma of a reducing gas species in the remote plasma source where the remote plasma includes radicals of the reducing gas species, exposing the metal seed layer of the substrate to the radicals of the reducing gas species, and exposing the substrate to a cooling gas.

In some embodiments, the controller includes instructions for moving the substrate to the actuated position via the one or more movable members before exposing the substrate to a cooling gas. In some embodiments, the controller includes instructions for heating the substrate support to a processing temperature between about 0° C. and about 400° C. during the operations of moving the substrate to the unactuated position through exposing the metal seed layer of the substrate to the radicals of the reducing gas species. In some embodiments, exposing the substrate to the cooling gas includes cooling the substrate to a temperature below about 30° C. In some embodiments, the remote plasma apparatus is part of an electroplating apparatus. In some embodiments, the one or more movable members are configured to move the substrate between an actuated and an unactuated position, where the distance between the showerhead and the substrate in the actuated position is between about 0.05 inches and about 0.75 inches, and the distance between the showerhead and the substrate in the unactuated position is between about 1 inch and about 5 inches.

This disclosure also pertains to a method of treating a substrate with a metal seed layer. The method includes providing the substrate in a processing chamber, moving the substrate towards a substrate support in the processing chamber, forming a remote plasma of a reducing gas species in a remote plasma source where the remote plasma includes radicals of the reducing gas species, exposing the metal seed layer of the substrate to the radicals of the reducing gas species, and exposing the substrate to a cooling gas.

In some embodiments, the method further includes heating a substrate support to a processing temperature between about 0° C. and about 400° C. In some embodiments, the method further includes maintaining a temperature of the showerhead below about 30° C. In some embodiments, the method further includes moving the substrate towards the showerhead via one or more movable members before exposing the substrate to a cooling gas. In some embodiments, the method further includes adjusting a temperature of the substrate, where adjusting the temperature of the substrate is configured by positioning the substrate via one or more movable members between a showerhead and the substrate support.

This disclosure also pertains to a remote plasma apparatus for treating a substrate with a metal seed layer. The remote plasma apparatus includes a processing chamber, a substrate support for holding the substrate in the processing chamber, a remote plasma source over the substrate support, a showerhead between the remote plasma source and the substrate support, and a controller. The controller includes instructions for performing the operations of providing the substrate with the metal seed layer in the processing chamber, where a portion of the metal seed layer has been converted to oxide of the metal, forming a remote plasma of a reducing gas species in a remote plasma source, where the remote plasma includes one or more of: radicals, ions, and ultraviolet (UV) radiation from the reducing gas species, and exposing the metal seed layer of the substrate to the remote plasma, where the exposure reduces the oxide of the metal and reflows the metal in the metal seed layer.

In some embodiments, the remote plasma includes at least two of the following: radicals, ions, and UV radiation from the reducing gas species. In some embodiments, the remote plasma further includes neutral molecules of the reducing gas species, and exposing the metal seed layer to the remote plasma includes exposing the metal seed layer to neutral molecules of the reducing gas species. In some embodiments, the showerhead includes a plurality of holes. The number of holes in the showerhead can be between about 100 and about 900 holes. The average diameter of the holes can be between about 0.05 inches and about 0.5 inches. In some embodiments, the remote plasma apparatus can further include a UV source, where the controller can further include instructions for exposing the reducing gas species to UV radiation from the UV source to form radicals of the reducing gas species.

This disclosure also pertains to a method of treating a substrate with a metal seed layer. The method includes providing the substrate with the metal seed layer in a processing chamber, where a portion of the metal seed layer has been converted to oxide of the metal, forming a remote plasma of a reducing gas species in a remote plasma source, where the remote plasma includes one or more of: radicals, ions, and UV radiation from the reducing gas species, and exposing the metal seed layer to the remote plasma, where exposure reduces the oxide of the metal and reflows the metal in the metal seed layer.

In some embodiments, the remote plasma includes radicals, ions, and UV radiation from the reducing gas species. Exposing the metal seed layer to the remote plasma includes introducing the radicals, the ions, and the UV radiation from the reducing gas species through a showerhead between the remote plasma source and the processing chamber, where the showerhead includes a plurality of holes. In some embodiments, the number of holes in the showerhead is between about 100 and about 900 holes. In some embodiments, the average diameter of the holes is between about 0.05 inches and about 0.5 inches.

BRIEF DESCRIPTION OF THE DRAWINGS

FIG. 4A shows an example of a cross-sectional schematic of an oxidized metal seed layer.

FIG. 4B shows an example of a cross-sectional schematic of a metal seed layer with a void due to removal of metal oxide.

FIG. 4C shows an example of a cross-sectional schematic of a metal seed layer with reduced metal oxide forming a reaction product not integrated with the metal seed layer.

FIG. 4D shows an example of a cross-sectional schematic of a metal seed layer with reduced metal oxide forming a film integrated with the metal seed layer.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Although the present invention may be used in a variety of applications, one very useful application is the damascene or dual damascene process commonly used in the manufacture of semiconductor devices. The damascene or dual damascene processes may include metal interconnects, such as copper interconnects.

A generalized version of a dual damascene technique may be described with reference to FIGS. 1A-1C, which depicts some of the stages of the dual damascene process.

Figure 1A:
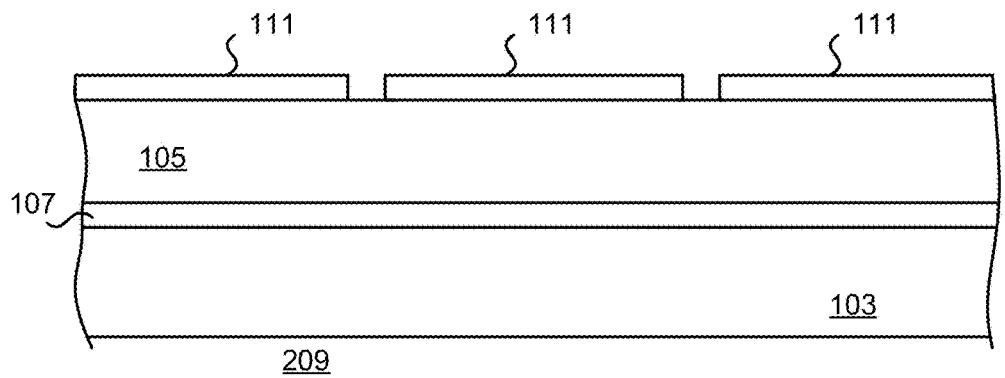
FIG. 1A shows an example of a cross-sectional schematic of dielectric layers prior to a via etch in a damascene process.
Figure 1B:
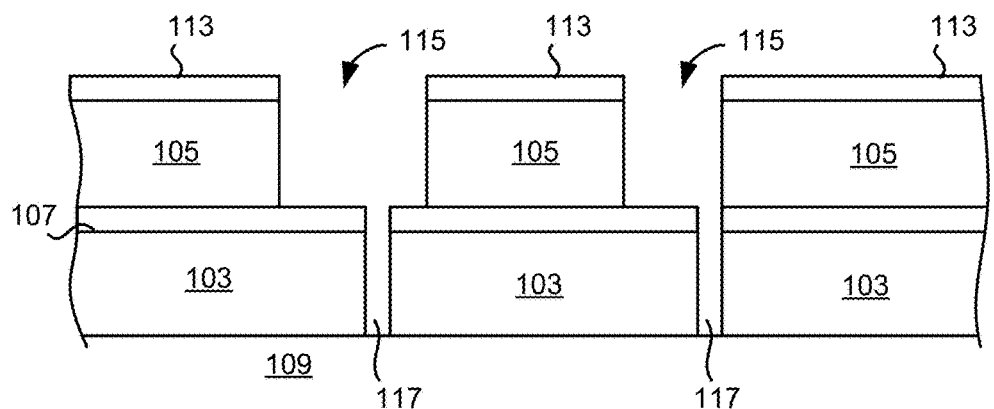
FIG. 1B shows an example of a cross-sectional schematic of the dielectric layers in FIG. 1A after an etch has been performed in the damascene process.
Figure 1C:
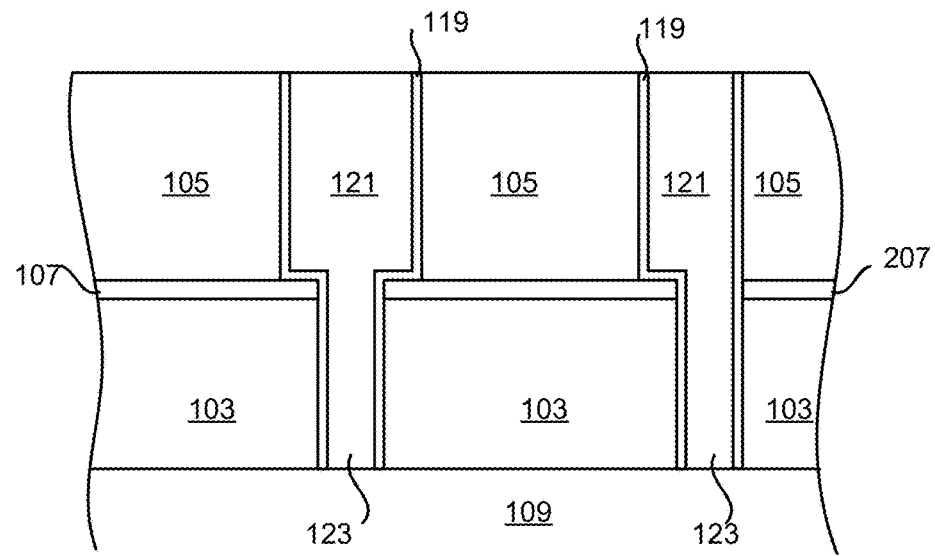
FIG. 1C shows an example of a cross-sectional schematic of the dielectric layers in FIGS. 1A and 1B after the etched regions have been filled with metal in the damascene process.

FIG. 1A shows an example of a cross-sectional schematic of one or more dielectric layers prior to a via etch in a damascene process. In a dual damascene process, first and second layers of dielectric are normally deposited in succession, possibly separated by deposition of an etch stop layer, such as a silicon nitride layer. These layers are depicted in FIG. 1A as a first dielectric layer 103, second dielectric layer 105, and etch stop layer 107. These are formed on an adjacent portion of a substrate 109, which a portion may be an underlying metallization layer or a gate electrode layer (at the device level).

After deposition of the second dielectric layer 105, the process forms a via mask 111 having openings where vias will be subsequently etched. FIG. 1B shows an example of a cross-sectional schematic of the one or more dielectric layers in FIG. 1A after an etch has been performed in the damascene process. Next, vias are partially etched down through the level of etch stop 107. Then via mask 111 is stripped off and replaced with a line mask 113 as depicted in FIG. 1B. A second etch operation is performed to remove sufficient amounts of dielectric to define line paths 115 in second dielectric layer 105. The etch operation also extends via holes 117 through first dielectric layer 103, down to contact the underlying substrate 109 as illustrated in FIG. 1B.

Thereafter, the process forms a thin layer of relatively conductive barrier layer material 119 on the exposed surfaces (including sidewalls) of dielectric layers 103 and 105. FIG. 1C shows an example of a cross-sectional schematic of the etched the dielectric layers in FIGS. 1A and 1B after the etched regions have been coated with a conductive barrier layer material and filled with metal in the damascene process. Conductive barrier layer material 119 may be formed, for example, of tantalum nitride or titanium nitride. A chemical vapor deposition (CVD), an atomic layer deposition (ALD), or a physical vapor deposition (PVD) operation is typically employed to deposit the conductive barrier layer material 119.

On top of the conductive barrier layer material 119, the process then deposits conductive metal 121 (typically, though not necessarily, copper) in the via holes and line paths 117 and 115. Conventionally this deposition is performed in two steps: an initial deposition of a metal seed layer followed by bulk deposition of metal by plating. However, the present disclosure provides a pre-treatment step prior to the bulk deposition step, as described in detail below. The metal seed layer may be deposited by PVD, CVD, electroless plating, or any other suitable deposition technique known in the art. Note that the bulk deposition of copper not only fills line paths 115 but, to ensure complete filling, covers all the exposed regions on top of second dielectric layer 105. The metal 121 may serve as copper interconnects for IC devices. In some embodiments, metals other than copper are used in the seed layer. Examples of such other metals include cobalt, tungsten, and ruthenium.

Metal seed layers can readily react with oxygen or water vapor in the air and oxidize from a pure metal into a mixed film of a metal oxide and a buried pure metal. While the oxidation under ambient conditions may be limited to a thin surface layer of some metals, that thin layer may represent a significant fraction or perhaps the entire thickness of thin seed layers used in current technology nodes. The relatively thin layers may be necessitated by the technology node, such as the 4× nm node, the 3× nm node, the 2× nm node, and the 1× nm node, and less than 10 nm. The height to width aspect ratio of vias and trenches in technology nodes necessitating relatively thin metal layers can be about 5:1 or greater. In such technology nodes, the thickness of the metal seed layer can be less than about 100 Å on average as a result. In some implementations, the thickness of the metal seed layer can be less than about 50 Å on average.

Through the general chemical reactions shown in Equation 1 and Equation 2 below, metals used for seed or barrier layers are converted to metal oxides (Mox), though the exact reaction mechanisms between the metal surfaces (M) and ambient oxygen or water vapor can vary depending on the properties and the oxidation state.

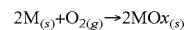
$$2M_{(s)}+O_{2(g)} \rightarrow 2MOx_{(s)} \quad\quad\quad \text{Equation 1}$$

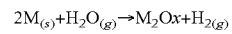
$$2M_{(s)}+H_2O_{(g)} \rightarrow M_2Ox+H_{2(g)} \quad\quad\quad \text{Equation 2}$$

For example, copper seed deposited on substrates is known to rapidly form copper oxide upon exposure to the air. A copper oxide film can form a layer that is approximately 20 Å and upwards to 50 Å thick on top of underlying copper metal. As metal seed layers become thinner and thinner, the formation of metal oxides from oxidation in ambient conditions can pose significant technical challenges.

Conversion of pure metal seed to metal oxide can lead to several problems. This is true not only in current copper damascene processing, but also for electrodeposition processes that use different conductive metals, such as ruthenium, cobalt, silver, aluminum, and alloys of these metals. First, an oxidized surface is difficult to plate on. Due to different interactions that electroplating bath additives can have on metal oxide and pure metal, non-uniform plating may result. As a result of the differences in conductivity between a metal oxide and a pure metal, non-uniform plating may further result. Second, voids may form in the metal seed that may make portions of the metal seed unavailable to support plating. The voids may form as a result of dissolution of metal oxide during exposure to corrosive plating solutions. The voids also may form on the surface due to non-uniform plating. Additionally, plating bulk metal on top of an oxidized surface can lead to adhesion or delamination problems, which can further lead to voids following subsequent processing steps, such as chemical mechanical planarization (CMP). Voids that result from etching, non-uniform plating, delamination, or other means may make the metal seed layer discontinuous, and unavailable to support plating. In fact, because modern damascene metal seed layers are relatively thin, such as about 50 Å or thinner, even a little oxidation may consume an entire layer thickness. Third, metal oxide formation may impede post-electrodeposition steps, such as capping, where the metal oxide may limit adhesion for capping layers.

Figure 2:
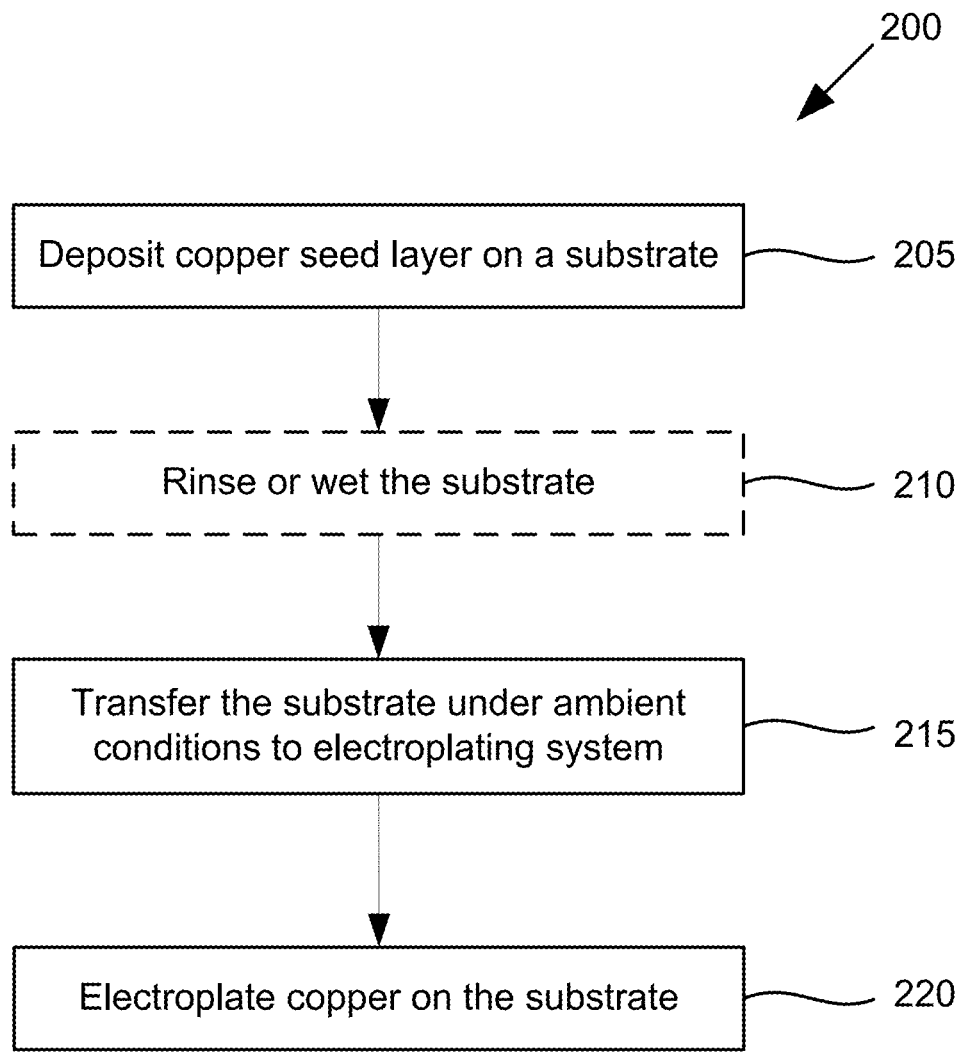
FIG. 2 shows an exemplary flow diagram illustrating a method of electroplating copper on a substrate.

After depositing a metal seed layer but prior to electroplating a bulk metal on the seed layer, it may be difficult to avoid formation of metal oxide on the metal seed layer. Various steps occur prior to electroplating the metal that may expose the metal seed layer to oxygen or water vapor in ambient conditions. For example, FIG. 2 shows an exemplary flow diagram illustrating a method of electroplating copper on a substrate. The process 200 may begin at step 205, where a process chamber or deposition chamber receives a substrate such as a semiconductor wafer. A metal seed layer such as a copper seed layer may be deposited on the substrate using a suitable deposition technique such as PVD.

At optional step 210, the substrate with the metal seed layer may be rinsed and dried. For example, the metal seed layer may be rinsed with de-ionized water. The rinsing step may be limited to a time, for example, of between about 1 and 10 seconds, but may take a longer or shorter time. Subsequently, the substrate may be dried, which can be between about 20 and 40 seconds, though the drying step may take a longer or shorter time. During this step, the metal seed layer may be exposed to oxidation.

At step 215, the substrate with the metal seed layer is transferred to the electroplating system or bath. During this transfer, the metal seed layer may be exposed to ambient conditions such that the metal seed layer may rapidly oxidize. In some embodiments, the duration of this exposure may be anywhere between about 1 minute and about 4 hours, between about 15 minutes and about 1 hour, or more. At step 220, bulk metal may be electroplated on the substrate. A substrate with a copper seed layer, for example, may be immersed in an electroplating bath containing positive ions of copper and associated anions in an acid solution. Step 220 of FIG. 2 can involve a series of processes that is described in U.S. Pat. No. 6,793,796, filed Feb. 28, 2001, the entirety of which is hereby incorporated by reference. The reference describes at least four phases of the electrofilling process and discloses controlled current density methods for each phase for optimal filling of relatively small embedded features.

With various steps that may expose the metal seed layer to oxidation between deposition of the metal seed layer and electroplating, a technique for reducing the negative effects of the metal oxide surfaces is needed. However, some of the current techniques may have drawbacks. Typically, the use of hydrogen-based plasmas may reduce thick metal oxides, but such techniques add substantial costs and utilize substantially high temperatures (e.g., at least over 200° C.) that can badly damage a thin metal seed layer resulting in high void counts within features. A thermal forming gas anneal to reduce thick metal oxides uses a forming gas (e.g., mixture of hydrogen and nitrogen gas) at temperatures higher than 150° C., which can cause metal seed to agglomerate and also lead to increased voiding. The use of acids or other chemical reagents may dissolve or etch thick metal oxides, but removal of such oxides results in increased void formation in regions where metal cannot be plated on, due to the creation of regions with insufficient seed layer where metal cannot be plated on.

The present disclosure provides methods for reducing metal oxide surfaces to modified metal surfaces. The method of reducing the metal oxide surfaces provides a substantially clean metallic surface that is substantially free of oxide when a substrate is introduced into the electroplating bath. The substrate that is substantially free of oxide may also be introduced into an electroless plating system or other metal deposition system. In addition, the method of reducing the metal oxide operates in relatively low temperatures, and the reduced metal oxide converts to metal to form a continuous film that is integrated with the metal seed layer and adherent to the underlying seed or substrate. Further, the method for reducing metal oxide surfaces can reflow the metal to reduce voids and gaps in the metal seed layer. Reflowing the metal can mobilize metal and redistribute atoms in the seed layer to improve seed coverage and/or smoothness, thereby forming a more uniform and continuous seed layer.

Method of Reducing Metal Oxides on a Metal Seed Layer

A method of preparing a substrate with a metal seed layer using a remote plasma can be disclosed. The substrate is maintained at a temperature below a temperature that produces agglomeration of the metal seed layer during exposure to the reducing gas atmosphere. The method further includes transferring the substrate to a plating bath containing a plating solution, and plating metal onto the metal seed layer using the plating solution.

Figure 3:
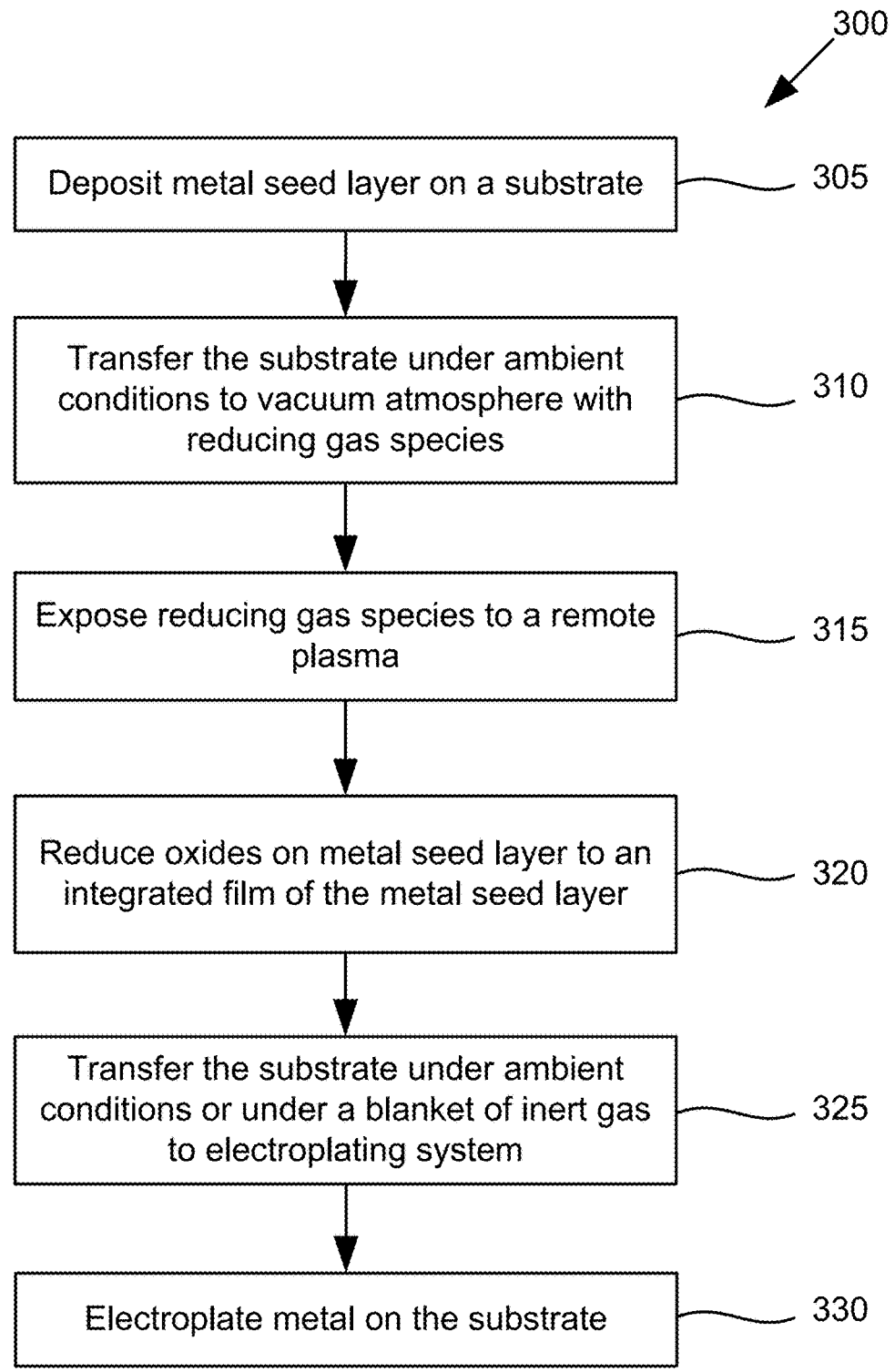
FIG. 3 shows an exemplary flow diagram illustrating a method of reducing metal oxides on a metal seed layer and plating metal on a substrate.

FIG. 3 shows an exemplary flow diagram illustrating a method of reducing oxides on a metal seed layer and plating metal on a substrate. The process 300 can begin with step 305 where a metal seed layer such as a thin copper layer is deposited on a substrate. This provides a substrate having the metal seed layer on a plating surface of the substrate. The substrate may have recesses having height to width aspect ratios of greater than about 3:1 or greater than about 5:1.

In some embodiments, the metal seed layer can include a semi-noble metal layer. The semi-noble metal layer may be part of a diffusion barrier or serve as the diffusion barrier. The semi-noble metal layer can include a semi-noble metal, such as ruthenium. Aspects of the semi-noble metal layer can be further described in U.S. Pat. No. 7,442,267, U.S. Pat. No. 7,964,506, U.S. Pat. No. 7,799,684, U.S. patent application Ser. No. 11/540,937, U.S. patent application Ser. No. 12/785,205, and U.S. patent application Ser. No. 13/367,710, each of which is incorporated in its entirety by reference. Step 305 can occur in a deposition apparatus such as a PVD apparatus. The process 300 can continue with step 310 where the substrate is transferred to a chamber or apparatus having a substantially reduced pressure or vacuum environment. The chamber or apparatus can include a reducing gas species. In some embodiments, the reducing gas species can include hydrogen ($H_2$), ammonia ($NH_3$), carbon monoxide (CO), diborane ($B_2H_6$), sulfite compounds, carbon and/or hydrocarbons, phosphites, and/or hydrazine ($N_2H_4$). During the transfer in step 310, the substrate may be exposed to ambient conditions that can cause the surface of the metal seed layer to oxidize. Thus, at least a portion of the metal seed layer may be converted to an oxidized metal.

At step 315, while the substrate is in the reduced or vacuum environment, the reducing gas species may be exposed to a remote plasma. The remote plasma may generate radicals of the reducing gas species, such as, for example, $H^*$, $NH_2^*$, or $N_2H_3^*$. The radicals of the reducing gas species react with the metal oxide surface to generate a pure metallic surface. As demonstrated below, Equation 3 shows an example a reducing gas species such as hydrogen gas being broken down into hydrogen radicals. Equation 4 shows the hydrogen radicals reacting with the metal oxide surface to convert the metal oxide to metal. For hydrogen gas molecules that are not broken down or hydrogen radicals that recombine to form hydrogen gas molecules, the hydrogen gas molecules can still serve as a reducing agent for converting the metal oxide to metal, as shown in Equation 5.

$$H_2 \rightarrow 2H^* \qquad\qquad \text{Equation 3}$$

$$(x)2H^* + MOx \rightarrow M + (x)H_2O \qquad\qquad \text{Equation 4}$$

$$xH_2 + MOx \rightarrow M + xH_2O \qquad\qquad \text{Equation 5}$$

The radicals of the reducing gas species, ions from the reducing gas species, ultraviolet (UV) radiation from the reducing gas species, or the reducing gas species itself reacts with the metal oxide under conditions that convert the metal oxide to metal in the form of a film integrated with the metal seed layer, as shown in step 320. Characteristics of the film integrated with the metal seed layer are discussed in further detail with respect to FIG. 4D below.

The remote plasma may generate and include ions and other charged species of the reducing gas species. The ions and charged species of the reducing gas species may move to the surface of the substrate to react or otherwise contact the metal seed layer. The ions or charged species may freely drift toward the surface of the substrate or be accelerated toward the surface of the substrate when an oppositely charged bias is provided on a substrate support. The ions or charged species may react with the metal oxide to reduce the metal oxide. In some implementations, the ions or charged species in the remote plasma can include, for example, $H^+$, $NH_2^+$, $NH_3^+$, and $H^-$. Ions or charged species may be advantageous for reducing oxide on metal seed layers depending on a thickness and nature of the oxide layers, which can form on cobalt, ruthenium, palladium, rhodium, iridium, osmium, nickel, gold, silver, aluminum, tungsten, and alloys thereof. For example, the ions or charged species may be beneficial for treatment of a seed layer containing cobalt.

The remote plasma may also generate and include UV radiation from the reducing gas species. Excitation of the reducing gas molecules from the remote plasma may cause emission of photons. The emitted photons may lead to one of several effects. First, the emitted photons in the UV spectrum may heat the surface of the substrate to activate the metal oxide surface so that radicals, ions, and other charged species can more readily react with the metal oxide surface. Second, reducing gas species may absorb the emitted photons and generate radicals of the reducing gas species. The generated radicals may react with the metal oxide surface to reduce the metal oxide. Third, the emitted photon may have sufficient energy to cause reduction of the metal oxide itself.

The process conditions for converting the metal oxide to metal in the form of a film integrated with the metal seed layer can vary depending on the choice of metal and/or on the choice of the reducing gas species. In some embodiments, the reducing gas species can include at least one of $H_2$, $NH_3$, CO, carbon and/or hydrocarbons, $B_2H_6$, sulfite compounds, phosphites, and $N_2H_4$. In addition, the reducing gas species can be combined with mixing gas species, such as relatively inert gas species. Examples of relatively inert gas species can include nitrogen ($N_2$), helium (He), neon (Ne), krypton (Kr), xenon (Xe), radon (Rn), and argon (Ar). The flow rate of the reducing gas species can vary depending on the size of the wafer for processing. For example, the flow rate of the reducing gas species can be between about 10 standard cubic centimeter per minute (sccm) and about 100,000 sccm for processing a single 450 mm wafer. Other wafer sizes can also apply. For example, the flow rate of the reducing gas species can be between about 500 sccm and about 30,000 sccm for processing a single 300 mm wafer.

Processing conditions such as temperature and pressure in the reducing chamber can also be controlled to permit conversion of the metal oxide to metal in the form of a film integrated with the metal seed layer. In some embodiments, the temperature of the reducing chamber can be relatively high to permit the dissociation of reducing gas species into radicals. For example, the reducing chamber can be anywhere between about 10° C. and about 500° C., such as between about 50° C. and about 250° C. Higher temperatures may be used to speed up metal oxide reduction reactions and shorten the duration of exposure to the reducing gas atmosphere. In some embodiments, the reducing chamber can have a relatively low pressure to substantially remove any oxygen from the reducing gas atmosphere, as minimizing the presence of oxygen in the atmosphere can reduce the effects of reoxidation. For example, the reducing chamber can be pumped down to a vacuum environment or a reduced pressure of between about 0.1 Torr and about 50 Torr. The increased temperature and/or the reduced temperature can also increase reflow of metal atoms in the metal seed layer to create a more uniform and continuous metal seed layer.

Although the reducing chamber can have a relatively high temperature to permit the dissociation of reducing gas species into radicals, the temperature of the substrate itself may be separately controlled to avoid or reduce damage to the metal seed layer. Depending on the type of metal in the metal seed layer, the metal can begin to agglomerate above a threshold temperature. The effects of agglomeration is more pronounced in relatively thin seed layers, especially in seed layers having a thickness less than about 100 Å. Agglomeration includes any coalescing or beading of a continuous or semi-continuous metal seed layer into beads, bumps, islands, or other masses to form a discontinuous metal seed layer. This can cause the metal seed layer to peel away from the surface upon which it is disposed and can lead to increased voiding during plating. For example, the temperature at which agglomeration begins to occur in copper is greater than about 100° C. Different agglomeration temperatures may be appropriate for different metals.

To control the temperature of the substrate and avoid or reduce the effects of agglomeration, a cooling system such as an actively cooled pedestal and/or gas flow cooling apparatus in the reducing chamber can be used to keep the local area of the substrate at temperatures below the agglomeration temperature. In some embodiments, the substrate may be supported upon and directly in contact with the pedestal. In some embodiments, a gap may exist between the pedestal and the substrate. Heat transfer can occur via conduction, convection, radiation, or combinations thereof.

In some implementations, an actively cooled pedestal provides a heat transfer element with resistive heating elements, cooling channels, or other heat sources or sinks embedded within the pedestal. For example, the pedestal can include cooling elements that permit a fluid such as water to circulate within the pedestal and actively cool the pedestal. In some embodiments, the cooling elements can be located outside the pedestal. In some embodiments, the cooling fluid can include a low-boiling fluid, such as glycols. Embodiments that include such cooling elements can be described in U.S. Pat. No. 7,327,948, issued Feb. 5, 2008; U.S. Pat. No. 7,941,039, issued Jan. 5, 2011; U.S. patent application Ser. No. 11/751,584, filed May 21, 2007; U.S. patent application Ser. No. 13/370,579, filed Feb. 10, 2012; and U.S. Pat. No. 8,137,465, issued Mar. 20, 2012, each of which are incorporated herein by reference in its entirety and for all purposes. Temperature in the pedestal can be actively controlled using a feedback loop.

In some implementations, a gap can exist between the pedestal and the substrate, and a conductive media such as gas can be introduced between the pedestal and the substrate to cool the substrate. In some embodiments, the conductive media can include helium. In some embodiments, the pedestal can be convex or concave to promote uniform cooling across the substrate. Examples of pedestal profiles can be described in U.S. patent application Ser. No. 11/129,266, filed May 12, 2005; U.S. patent application Ser. No. 11/546,189, filed Oct. 10, 2006; and U.S. patent application Ser. No. 12/749,170, filed Mar. 29, 2010, each of which is incorporated herein by reference in its entirety and for all purposes.

Different configurations can be utilized to efficiently cool and to maintain a substantially uniform temperature across the substrate. Some implementations of an active cooling system include a pedestal circulating water within the pedestal coupled with a uniform gas flow across the substrate. Other implementations include a pedestal resistively heated coupled with a uniform gas flow across the substrate. Other configurations and/or additions may also be provided with the active cooling system. For example, a removable ceramic cover can be inserted between the pedestal and the substrate to promote substantially uniform temperature across the substrate, as described in U.S. patent application Ser. No. 13/086,010, filed Apr. 13, 2011, which is incorporated herein by reference in its entirety and for all purposes. In some embodiments, gas flow can be controlled with minimum contact supports to rapidly and uniformly cool the substrate, as described in U.S. Pat. No. 8,033,771, issued Oct. 11, 2011, which is incorporated herein by reference in its entirety and for all purposes. In some embodiments, the heat transfer coefficient of the conductive media can be adjusted by varying the partial pressure of the conductive media as described in U.S. Pat. No. 8,288,288, issued Oct. 12, 2012, which is incorporated herein by reference in its entirety and for all purposes. Other configurations for a localized cooling system for maintaining a relatively low substrate temperature can be utilized as is known in the art.

The temperature of the substrate can be maintained at a temperature below the agglomeration temperature of the metal using any of the cooling systems discussed earlier herein or as is known in the art. In some embodiments, the substrate can be maintained at a temperature between about −10° C. and about 150° C. In copper seed layers, for example, the substrate can be maintained at a temperature between about 75° C. and about 100° C. In cobalt seed layers, the substrate can be maintained at a temperature greater than about 100° C.

The duration of exposure to the reducing gas atmosphere can vary depending on the other process parameters. For example, the duration of exposure to the reducing gas atmosphere can be shortened by increasing remote plasma power, temperature of the reducing chamber, etc. In certain embodiments, the duration of the exposure to reduce the metal oxide surfaces to pure metal in an integrated film with the metal seed layer can be between about 1 second and about 60 minutes. For example, for pretreatment of copper seed layers, the duration of the exposure can between about 10 seconds and about 300 seconds.

While most reducing treatments may require that the substrate be rinsed and dried prior to plating in order to clean the substrate surface, the substrate as exposed to a reducing gas atmosphere need not be rinsed and dried prior to plating. Thus, reducing metal oxide surfaces using a reducing gas atmosphere can avoid the additional step of rinsing and drying the substrate before plating, which can further reduce the effects of reoxidation.

In some implementations, the metal in the metal seed layer may be reflowed as a result of exposure to one or more of increased temperature, reduced pressure, UV radiation from a UV source, UV radiation from the remote plasma, and radicals, ions, and other charged species from the remote plasma. Such exposure can lead to atoms in the metal seed layer to enter a more excited state and become more mobile. The atoms can move around on an underlying layer to reduce voids/gaps. As a result, a more uniform and continuous metal seed layer can be created. In some implementations, the reflow and the reduction treatment can occur simultaneously.

At step 325 in FIG. 3, the substrate may be transferred under ambient conditions or under a blanket of inert gas to the electroplating system, electroless plating system, metal deposition system, or pretreating apparatus. Though metal oxides in the metal seed layer have been substantially reduced by exposing the metal oxide surfaces to a reducing gas atmosphere, performing step 325 may present an additional challenge of reoxidation from exposure to the ambient environment. In some embodiments, exposure to ambient conditions may be minimized using techniques such as shortening the duration of transfer or controlling the atmosphere during transfer. Additionally or alternatively, the transfer is conducted in a controlled environment that is less oxidizing than ambient conditions. To control the atmosphere during transfer, for example, the atmosphere may be substantially devoid of oxygen. The environment may be substantially inert and/or be low pressure or vacuum. In some embodiments, the substrate may be transferred under a blanket of inert gas. As discussed below, the transfer in step 325 may occur from a remote plasma apparatus to an electroplating system, where the remote plasma apparatus is integrated or otherwise connected to the electroplating system. At step 330, metal may be electroplated on to the substrate.

FIGS. 4A-4D show examples of cross-sectional schematics of a metal seed layer deposited on a conductive barrier layer. FIG. 4A shows an example of a cross-sectional schematic of an oxidized metal seed layer deposited over a conductive barrier layer 419. As discussed earlier herein, the metal seed layer 420 may be oxidized upon exposure to oxygen or water vapor in ambient conditions, which can convert metal to a metal oxide 425 in a portion of the metal seed layer 420.

FIG. 4B shows an example of a cross-sectional schematic of a metal seed layer with a void due to removal of metal oxide. As discussed earlier herein, some solutions treat the metal oxide 425 by removal of the metal oxide 425, resulting in voids 426. For example, the metal oxide 425 can be removed by oxide etching or oxide dissolution by an acid or other chemical. Because the thickness of the void 426 can be substantially large relative to the thinness of the metal seed layer 420, the effect of the void 426 on subsequent plating can be significant.

FIG. 4C shows an example of a cross-sectional schematic of a metal seed layer with reduced metal oxide forming a reaction product not integrated with the metal seed layer. As discussed earlier herein, some solutions reduce the metal oxide 425 under conditions that agglomerate metal with the metal seed layer 420. In some embodiments, reducing techniques generate metal particles 427, such as copper powder, that can agglomerate with the metal seed layer 420. The metal particles 427 do not form an integrated film with the metal seed layer 420. Instead, the metal particles 427 are not continuous, conformal, and/or adherent to the metal seed layer 420.

FIG. 4D shows an example of a cross-sectional schematic of a metal seed layer with reduced metal oxide forming a film integrated with the metal seed layer. In some embodiments, radicals from a reducing gas species, ions from the reducing gas species, UV radiation from the reducing gas species, or the reducing gas species itself can reduce the metal oxide 425. When process conditions for the reducing gas atmosphere are appropriately adjusted, the metal oxide 425 in FIG. 4A may convert to a film 428 integrated with the metal seed layer 420. The film 428 is not a powder. In contrast to the example in FIG. 4C, the film 428 can have several properties that integrate it with the metal seed layer 420. For example, the film 428 can be substantially continuous and conformal over the contours metal seed layer 420. Moreover, the film 428 can be substantially adherent to the metal seed layer 420, such that the film 428 does not easily delaminate from the metal seed layer 420.

Remote Plasma Apparatus

A remote plasma apparatus for treating a substrate with a metal seed layer is disclosed. The remote plasma apparatus includes a processing chamber, a substrate support for holding the substrate in the processing chamber, a remote plasma source over the substrate support, a showerhead between the remote plasma source and the substrate support, one or more movable members in the processing chamber, and a controller. The one or more movable members may be configured to move the substrate to positions between the showerhead and the substrate support. The controller may be configured to perform one or more operations, including providing the substrate in the processing chamber, moving the substrate towards the substrate support, forming a remote plasma of a reducing gas species in the remote plasma source where the remote plasma includes radicals of the reducing gas species, exposing the metal seed layer of the substrate to the radicals of the reducing gas species, and exposing the substrate to an inert gas.

The remote plasma apparatus can be configured to perform a plurality of operations that is not limited to treating a substrate with a remote plasma. The remote plasma apparatus can be configured to transfer (such as load/unload) a substrate efficiently to and from an electroplating apparatus, electroless plating apparatus, or other metal deposition apparatus. The remote plasma apparatus can be configured to efficiently control the temperature of the substrate by positioning the substrate using movable members and/or the using substrate support. The remote plasma apparatus can be configured to efficiently control the temperature of the substrate by controlling the temperature of the substrate support and the temperature of the showerhead. The remote plasma apparatus can be configured to tune the rate of reduction reaction and the uniformity of the reduction reaction by positioning the substrate support relative to the showerhead. The remote plasma apparatus can be configured to control the environmental conditions surrounding the substrate by controlling the gases and flow rates of the gases delivered into the processing chamber. Such operations can improve the processing of the substrate while also integrating additional operations into a single standalone apparatus. Thus, a single apparatus can be used for treating and cooling the substrate, rather than using two separate modules. Furthermore, by configuring the remote plasma apparatus to be able to perform some of the operations described above, the remote plasma apparatus can reduce potential oxidation of the metal seed layer before, during, and after processing of the substrate.

In some implementations, the remote plasma apparatus can include a processing chamber, a substrate support for holding a substrate having a metal seed layer in the processing chamber, a remote plasma source over the substrate support, a showerhead between the remote plasma source and the substrate support, and a controller. The controller may be configured to perform one or more operations, including providing the substrate with the metal seed layer in the processing chamber, where a portion of the metal seed layer has been converted to oxide of the metal, forming a remote plasma in the remote plasma source, where the remote plasma includes one or more of: radicals, ions, and UV radiation from the reducing gas species, and exposing the metal seed layer of the substrate to the remote plasma, where exposure reduces the oxide of the metal and reflows the metal in the metal seed layer.

In some implementations, the remote plasma apparatus can further include a UV source. The UV source can include UV broadband lamps such as mercury lamps, UV excimer lamps, UV excimer lasers, and other appropriate UV sources. Aspects of the UV source can be described in U.S. patent application Ser. No. 13/787,499, filed Mar. 6, 2013, which is incorporated herein by reference in its entirety and for all purposes. In some implementations, the reducing gas species can be exposed to UV radiation from the UV source to form radicals and other charged species of the reducing gas species, which can react with a metal oxide surface of a metal seed layer to reduce metal oxide.

Figure 5:
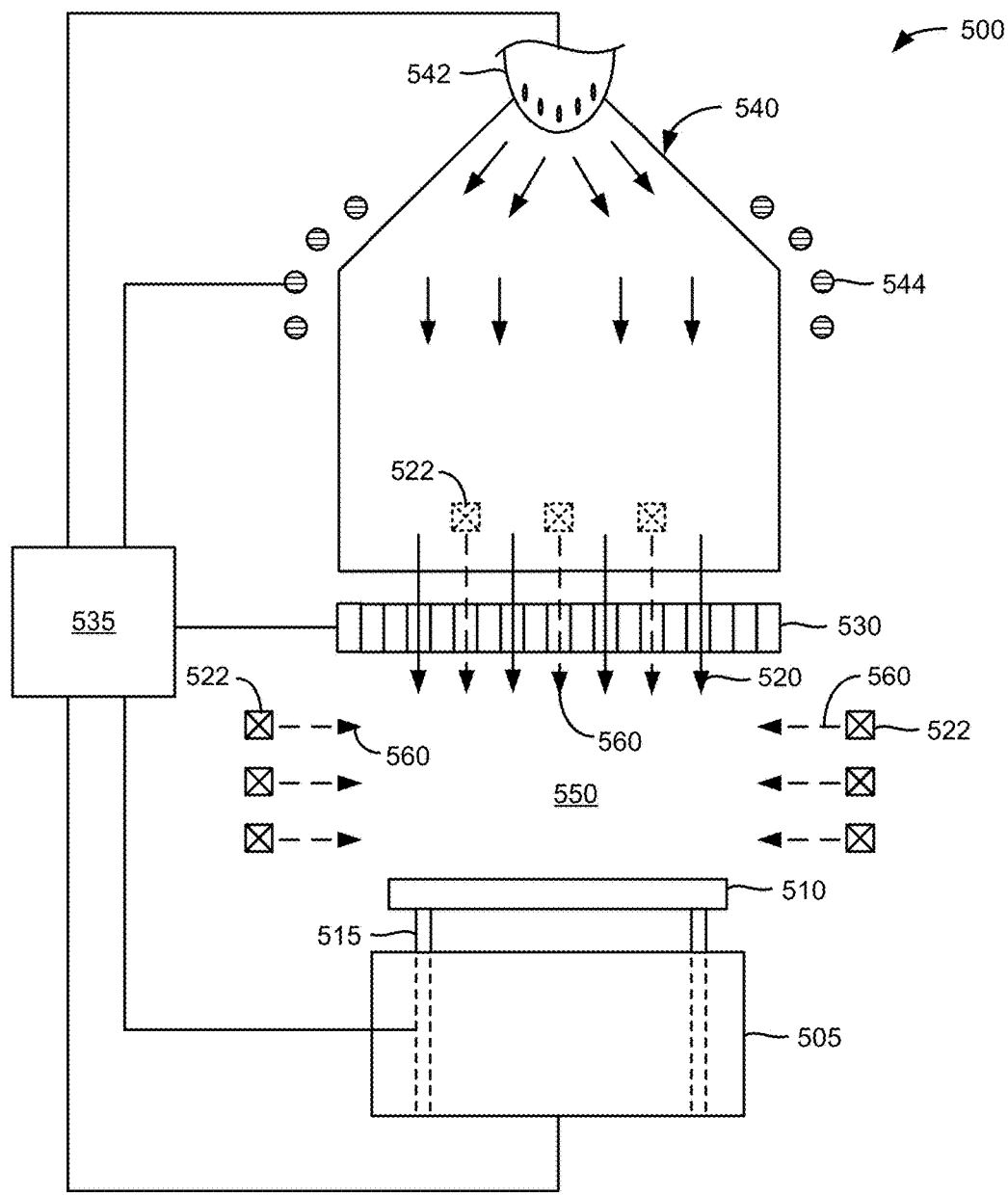
FIG. 5 shows an example of a cross-sectional schematic diagram of a remote plasma apparatus with a processing chamber.

FIG. 5 shows an example of a cross-sectional schematic diagram of a remote plasma apparatus with a processing chamber. The remote plasma apparatus 500 includes a processing chamber 550, which includes a substrate support 505 such as a pedestal, for supporting a substrate 510. The remote plasma apparatus 500 also includes a remote plasma source 540 over the substrate 510, and a showerhead 530 between the substrate 510 and the remote plasma source 540. A reducing gas species 520 can flow from the remote plasma source 540 towards the substrate 510 through the showerhead 530. A remote plasma may be generated in the remote plasma source 540 to produce radicals of the reducing gas species 520. The remote plasma may also produce ions and other charged species of the reducing gas species. The remote plasma may further generate photons, such as UV radiation, from the reducing gas species. For example, coils 544 may surround the walls of the remote plasma source 540 and generate a remote plasma in the remote plasma source 540.

In some embodiments, the coils 544 may be in electrical communication with a radio frequency (RF) power source or microwave power source. An example of a remote plasma source 540 with an RF power source can be found in the GAMMA®, manufactured by Lam Research Corporation of Fremont, Calif. Another example of an RF remote plasma source 540 can be found in the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used with the remote plasma source 540, as found in the Astex®, also manufactured by MKS Instruments. A microwave plasma can be configured to operate at a frequency of 2.45 GHz.

In embodiments with an RF power source, the RF generator may be operated at any suitable power to form a plasma of a desired composition of radical species. Examples of suitable powers include, but are not limited to, powers between about 0.5 kW and about 6 kW. Likewise, the RF generator may provide RF power of a suitable frequency, such as 13.56 MHz for an inductively-coupled plasma.

Reducing gas species 520 are delivered from a gas inlet 542 and into an internal volume of the remote plasma source 540. The power supplied to the coils 544 can generate a remote plasma with the reducing gas species 520 to form radicals of the reducing gas species 520. The radicals formed in the remote plasma source 540 can be carried in the gas phase towards the substrate 510 through the showerhead 530. An example of a remote plasma source 655 with such a configuration can be described in U.S. Pat. No. 8,084,339, issued Dec. 27, 2011, which is incorporated herein by reference in its entirety and for all purposes. The radicals of the reducing gas species 520 can reduce metal oxides on the surface of the substrate 510.

In addition to radicals of the reducing gas species, the remote plasma can also generate and include ions and other charged species of the reducing gas species 520. In some embodiments, the remote plasma may include neutral molecules of the reducing gas species 520. Some of the neutral molecules may be recombined molecules of charged species from the reducing gas species 520. The neutrals or recombined molecules of the reducing gas species 520 can also reduce metal oxides on the surface of the substrate 510, though they may take longer to react and reduce the metal oxides than the radicals of the reducing gas species 520. The ions may drift to the surface of the substrate 510 and reduce the metal oxides, or the ions may be accelerated toward the surface of the substrate 510 to reduce the metal oxides if the substrate support 505 has an oppositely charged bias. Having species with higher ion energies can allow deeper implantation into the metal seed layer to create metastable radical species further from the surface of the substrate 510. For example, if the substrate 510 has high aspect ratio features, such as between about 10:1 and about 60:1, ions with higher ionic energies may penetrate deeper into such features to provide reduction of the metal oxide more throughout the features. In contrast, some of the radicals of the reducing gas species 520 from remote plasma generation may recombine in the field or near the top of the features. The ions with higher ionic energies (such as 10 eV-100 eV) can also be used to re-sputter and reflow the metal in the metal seed layer, which can result in a more uniform seed coverage and reduce the aspect ratio for subsequent plating or metal deposition (such as PVD, CVD, ALD).

In FIG. 5, the remote plasma apparatus 500 may actively cool or otherwise control the temperature of the substrate 510. In some embodiments, it may be desirable to control the temperature of the substrate 510 to control the rate of the reduction reaction and the uniformity of exposure to the remote plasma during processing. It may also be desirable to control the temperature of the substrate 510 to reduce the effects of oxidation on the substrate 510 before, during, and/or after processing.

In some embodiments, the remote plasma apparatus 500 can include movable members 515, such as lift pins, that are capable of moving the substrate 510 away from or towards the substrate support 505. The movable members 515 may contact the lower surface of the substrate 510 or otherwise pick up the substrate 510 from the substrate support 505. In some embodiments, the movable members 515 may move the substrate 510 vertically and control the spacing between the substrate 510 and the substrate support 505. In some embodiments, the movable members 515 can include two or more actuatable lift pins. The movable members 515 can be configured to extend between about 0 inches and about 5 inches, or more, away from the substrate support 505. The movable members 515 can extend the substrate 510 away from a hot substrate support 505 and towards a cool showerhead 530 to cool the substrate 510. The movable members 515 can also retract to bring the substrate 510 towards a hot substrate support 505 and away from a cool showerhead 530 to heat the substrate 510. By positioning the substrate 510 via the movable members 515, the temperature of the substrate 510 can be adjusted. When positioning the substrate 510, the showerhead 530 and the substrate support 505 can be held at a constant temperature.

In some embodiments, the remote plasma apparatus 500 can include a showerhead 530 that allows for control of the showerhead temperature. An example of a showerhead configuration that permits temperature control can be described in U.S. Pat. No. 8,137,467, issued Mar. 20, 2012, and U.S. Patent Publication No. 2009/0095220, published Apr. 16, 2009, both of which are incorporated herein by reference in their entirety and for all purposes. Another example of a showerhead configuration that permits temperature control can be described in U.S. Patent Publication No. 2011/0146571, published Jun. 23, 2011, which is incorporated herein by reference in its entirety and for all purposes. To permit active cooling of the showerhead 530, a heat exchange fluid may be used, such as deionized water or a thermal transfer liquid manufactured by the Dow Chemical Company in Midland, Mich. In some embodiments, the heat exchange fluid may flow through fluid channels (not shown) in the showerhead 530. In addition, the showerhead 530 may use a heat exchanger system (not shown), such as a fluid heater/chiller to control temperature. In some embodiments, the temperature of the showerhead 530 may be controlled to below about 30° C., such as between about 5° C. and about 20° C. The showerhead 530 may be cooled to reduce damage to the metal seed layer that may result from excess heat during processing of the substrate 510. The showerhead 530 may also be cooled to lower the temperature of the substrate 510, such as before and after processing the substrate 510.

In some embodiments, the showerhead 530 may include a plurality of holes. Increasing the size and number of holes in the showerhead 530 and/or decreasing the thickness of the showerhead 530 may permit greater flow of radicals, ions, and UV radiation from the reducing gas species 520 through the showerhead 530. Exposing the metal seed layer to more radicals, ions, and UV radiation can provide more UV exposure and energetic species to reduce metal oxide in the metal seed layer. In some embodiments, the showerhead 530 can include between about 100 and about 900 holes. In some embodiments, an average diameter of the holes can be between about 0.05 and about 0.5 inches. This can result in an open area in the showerhead 530 due to holes of between about 3.7% and about 25%. In some embodiments, the showerhead 530 can have a thickness between about 0.25 and about 3.0 inches.

In some embodiments, the substrate support 505 may be configured to move to and away from the showerhead 530. The substrate support 505 may extend vertically to control the spacing between the substrate 510 and the showerhead 530. When reducing metal oxides on the substrate 510, the uniformity as well as the rate of the reduction on the substrate 510 may be tuned. For example, if the substrate support 505 is closer to the showerhead 530, reduction of the metal oxide on the surface of the substrate 510 may proceed faster. However, the center of the substrate 510 may get hotter than the edges of the substrate 510, which can result in a less uniform reduction treatment. Accordingly, the spacing between the substrate 510 and the showerhead 530 can be adjusted to obtain a desired rate and uniformity for processing the substrate 510. In some embodiments, the substrate support 505 can be configured to extend between about 0 inches and about 5 inches, or greater than about 5 inches, from the showerhead 530.

In some embodiments, the temperature of the substrate support 505 may also be adjusted. In some embodiments, the substrate support 505 can be a pedestal with one or more fluid channels (not shown). The fluid channels may circulate a heat transfer fluid within the pedestal to actively cool or actively heat the pedestal, depending on the temperature of the heat transfer fluid. Embodiments that include such fluid channels and heat transfer fluids can be described in actively cooled pedestal systems discussed earlier herein. The circulation of the heat transfer fluid through one or more fluid channels can control the temperature of the substrate support 505. Temperature control of the substrate support 505 can control the temperature of the substrate 510 to a finer degree. In some embodiments, the temperature of the substrate support 505 can be adjusted to be between about 0° C. and about 400° C.

In some embodiments, the remote plasma apparatus 500 can include one or more gas inlets 522 to flow cooling gas 560 through the processing chamber 550. The one or more gas inlets 522 may be positioned above, below, and/or to the side of the substrate 510. Some of the one or more gas inlets 522 may be configured to flow cooling gas 560 in a direction that is substantially perpendicular to the surface of the substrate 510. In some embodiments, at least one of the gas inlets 522 may deliver cooling gas 560 through the showerhead 530 to the substrate 510. Some of the one or more gas inlets 522 may be parallel to the plane of the substrate 510, and may be configured to deliver a cross-flow of cooling gas 560 across the surface of the substrate 510. In some embodiments, the one or more gas inlets 522 may deliver cooling gas 560 above and below the substrate 510. The flow of cooling gas 560 across the substrate 510 can enable rapid cooling of the substrate 510. Rapid cooling of the substrate 510 can reduce the oxidation of the metal seed layer in the substrate 510. Such cooling of the substrate 510 may take place before and after processing of the substrate 510. The flow rate of the cooling gas 560 for cooling can be between about 0.1 standard liters per minute (slm) and about 100 slm.

Examples of cooling gas 560 can include a relatively inert gas, such as nitrogen, helium, neon, krypton, xenon, radon, and argon. In some embodiments, the cooling gas 560 can include at least one of nitrogen, helium, and argon.

In some embodiments, the cooling gas 560 can be delivered at room temperature, such as between about 10° C. and about 30° C. In some embodiments, the cooling gas 560 can be delivered at a temperature less than room temperature. For example, a cold inert gas may be formed by expanding a cold liquid to gas, such as liquid argon, helium, or nitrogen. Thus, the temperature range of the cooling gas 560 used for cooling can be broadened to be anywhere between about −270° C. and about 30° C.

In some embodiments, the remote plasma apparatus 500 may be part of or integrated with an electroplating apparatus (not shown). This can be shown in FIGS. 8B and 8C, which is discussed in more detail below. Oxidation of the metal seed layer in the substrate 510 can occur rapidly during exposure to ambient conditions. By attaching or otherwise connecting the remote plasma apparatus 500 to the electroplating apparatus, the duration of exposure to ambient conditions of the substrate 510 can be reduced. For example, the transfer time between the remote plasma apparatus following treatment and the electroplating apparatus can be between about 15 seconds and about 90 seconds, or less than about 15 seconds.

Table I summarizes exemplary ranges of process parameters that can be used with certain embodiments of a remote plasma apparatus 500.

TABLE I

| Parameter | Parameter Range |
|---|---|
| Pedestal Temperature | 0° C.-400° C. |
| Showerhead Temperature | 5° C.-30° C. |
| Pedestal Dropping Vertical Travel | 0"-5" |
| Lift Pins Raising Vertical Travel | 0"-5" |
| Cooling Gas Flow (N$_2$/Ar/He - pure or mixture) | 0.1-100 slm |
| Cooling Gas Temperature | −270° C.-30° C. |
| Process Gas Flow (H$_2$/He/NH$_3$ - pure or mixture) | 0.5 slm-30 slm |
| Process Pressure | 0.5-6 Torr |
| Venting Gas Flow | Nominally same as cooling gas |
| Venting Gas | Nominally same as cooling gas |
| RF Plasma Power | 0.5-6 kW |
| Remote Plasma Apparatus to Electroplating Apparatus Transfer Time | 15-90 seconds |
| Showerhead hole number | 100-900 |
| Showerhead thickness | 0.25"-3.0" |
| Showerhead hole diameter | 0.05"-0.5" |
| Showerhead open area due to holes | 3.7%-25% |

A controller 535 may contain instructions for controlling parameters for the operation of the remote plasma apparatus 500. The controller 535 will typically include one or more memory devices and one or more processors. The processor may include a CPU or computer, analog and/or digital input/output connections, stepper motor controller boards, etc. Aspects of the controller 535 may be further described with respect to the controller in FIGS. 8A and 8B.

Figure 6A:
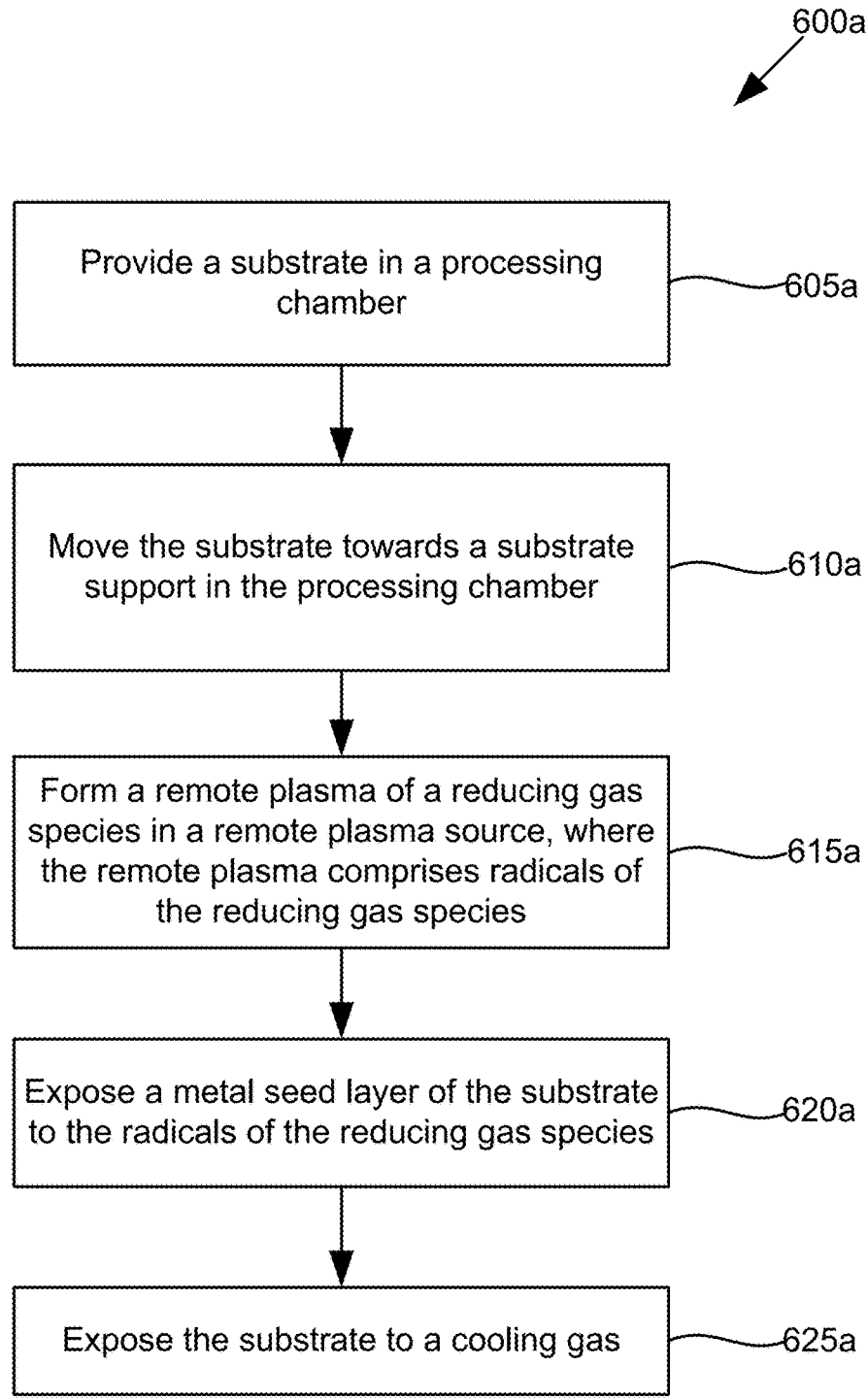
FIG. 6A shows an exemplary flow diagram illustrating a method of treating a substrate with a metal seed layer.

FIG. 6A shows an exemplary flow diagram illustrating a method of treating a substrate with a metal seed layer. FIGS. 7A-7D show examples of cross-sectional schematic diagrams illustrating various stages of treating a substrate with a metal seed layer using a remote plasma apparatus. Some of the steps discussed in FIG. 6A may be discussed with respect to a corresponding cross-sectional schematic diagram in FIGS. 7A-7D.

In FIG. 6A, the process 600a can begin with step 605a where a substrate is provided in a processing chamber. The substrate can include a metal seed layer, where a portion of the metal seed layer has been converted to oxide of the metal. Prior to treatment of the substrate by a remote plasma, the substrate can be loaded into a processing chamber of a remote plasma apparatus. In some embodiments, the substrate can be provided on one or more movable members in an actuated position. In some embodiments, inert gas may be flowed through the processing chamber to cool the substrate during loading. This can reduce additional oxidation of the substrate during loading. In some embodiments, upon loading the substrate into the processing chamber, the processing chamber can be closed and pumped down to vacuum or to a reduced pressure. This can provide an environment that is substantially free of oxygen. The pressure of the processing chamber can be between about 0.5 Torr and about 6 Torr, such as between about 0.5 Torr and 3 Torr. Reduced pressures can reduce the presence of oxygen in the environment. Thus, loading the substrate into the processing chamber in such conditions can reduce additional oxidation of the metal seed layer.

Figure 7A:
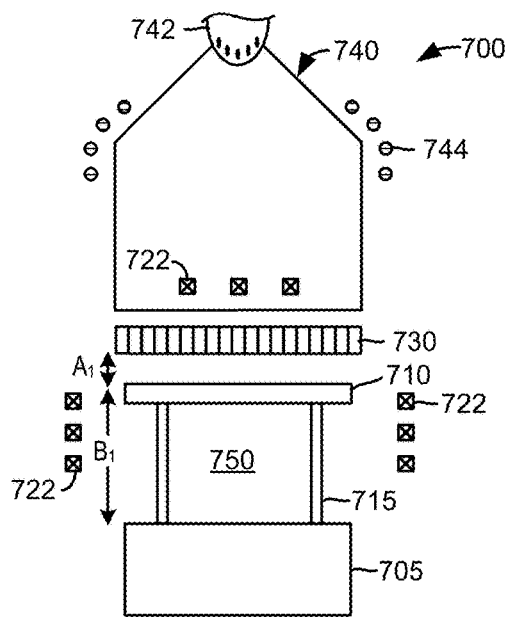
FIGS. 7A-7D show examples of cross-sectional schematic diagrams illustrating various stages of treating a substrate with a metal seed layer using a remote plasma apparatus.

FIG. 7A shows an example of a cross-sectional schematic diagram of a remote plasma apparatus 700 at one of the stages of treating a substrate with a metal seed layer (such as at step 605a). The remote plasma apparatus 700 includes a substrate support 705 in a processing chamber 750, a remote plasma source 740 over the substrate support 705, and a showerhead 730 between the remote plasma source 740 and the substrate support 705. Movable members 715 may extend from the substrate support 705 towards the showerhead 730 to position the substrate 710. Examples of movable members can include lift pins and peripheral grips. The substrate 710 may include a metal seed layer, where the metal seed layer includes at least one of Cu, Co, Ru, Pd, Rh, Ir, Os, Ni, Au, Ag, Al, and W. In some embodiments, the thickness of the metal seed layer can be less than about 100 Å.

Figure 7B:
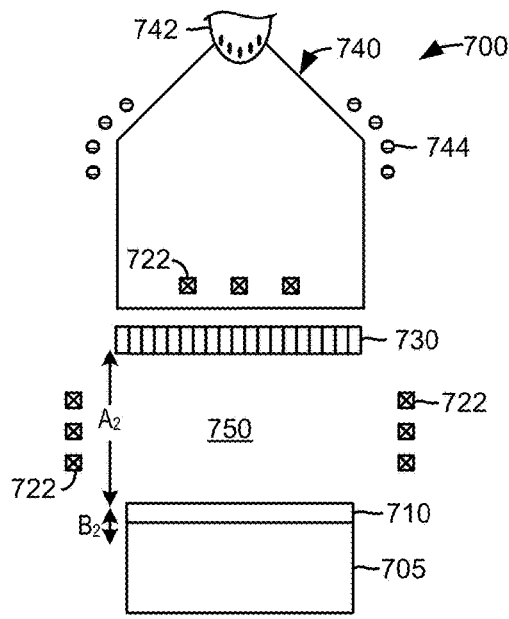

In FIG. 7A, the movable members 715 in a processing chamber 750 may position a substrate 710 in an actuated position. The actuated position can place the substrate 710 at a distance $A_1$ closer to the showerhead 730 than an unactuated position (as illustrated in FIG. 7B). In the actuated position, the distance $A_1$ between the substrate 710 and the showerhead 730 can be between about 0.05 inches and about 0.75 inches. A distance $B_1$ between the substrate 710 and the substrate support 705 can be any desired distance. For example, the distance $B_1$ can be greater than about 1 inch, such as between about 1 inch and about 5 inches. The showerhead 730 can be maintained at a relatively cool temperature, such as less than about 30° C.

Returning to FIG. 6A, at step 610a, the substrate is moved towards a substrate support in the processing chamber. In some embodiments, the substrate can be moved via the movable members to an unactuated position. The unactuated position is further from a showerhead in the processing chamber than the actuated position. In some embodiments, the substrate in the unactuated position may be in contact with the substrate support. For example, the movable members may be retracted so that the substrate can rest on the substrate support. In some embodiments, a gap can exist between the substrate support and the substrate, and heat transfer can occur via conduction, convection, radiation, or combinations thereof. The substrate support can be heated, which in turn can heat the substrate. The substrate support may be heated to a processing temperature, such as a temperature between about 0° C. and about 400° C. The temperature of the substrate support can depend on the metal seed layer of the substrate. For example, the substrate support can be heated between about 250° C. and about 300° C. for cobalt, and between about 75° C. and about 100° C. for copper. Higher temperatures of the substrate can speed up the metal oxide reduction reactions. However, the temperature may be selected to not exceed an agglomeration temperature of the metal seed layer. When the substrate is heated, the substrate may be exposed to a remote plasma treatment.

FIG. 7B shows an example of a cross-sectional schematic diagram of a remote plasma apparatus 700 at one of the stages of treating a substrate with a metal seed layer (such as at step 610a). The remote plasma apparatus 700 includes a substrate 710 over the substrate support 705, where the substrate 710 is in the unactuated position. In the unactuated position, the substrate 710 is positioned at a distance $A_2$ from the showerhead 730 and is further away from the showerhead 730 than in the actuated position. The distance $A_2$ between the showerhead 730 and the substrate 710 can be greater than about 1 inch, such as between about 1 inch and about 5 inches. The substrate 710 and the substrate support 705 can be in contact with each other, or a distance $B_2$ between the substrate 710 and the substrate support 705 can be relatively small so as to allow efficient heat transfer between the substrate 710 and the substrate support 705. In some embodiments, the distance $B_2$ can be between about 0 inches and about 0.5 inches. In some embodiments, the movable members 715 can be retracted so that the substrate 710 rests on the substrate support 705. The substrate support 705 can position the substrate 710 relative to the showerhead 730 by vertically moving the substrate support 710. The showerhead 730 can be maintained at a relatively cool temperature, such as less than about 30° C.

The distance $A_2$ can be adjusted and can tune the rate of reaction and the uniformity of reaction during processing of the substrate. For example, where the substrate support 705 is closer to the showerhead 730, the rate of reduction may proceed faster but achieve less uniform results. The distance $A_2$ can be adjusted by vertical movement of the substrate support 705. In some embodiments, the substrate support 705 may move from a first position to a second position in the processing chamber, where a distance between the first position and the second position is greater than about 1 inch. An increased degree of freedom for positioning the substrate support 705 provides greater flexibility in tuning the rate and uniformity of the subsequent reduction treatment.

Returning to FIG. 6A, at step 615a, a remote plasma can be formed of a reducing gas species in a remote plasma source, where the remote plasma includes radicals of the reducing gas species. The remote plasma can be formed by exposing the reducing gas species to a source of energy. The energy source can produce radicals, ions, and other charged species that can be flowed towards the substrate. In some embodiments, the energy source can be an RF discharge. When the remote plasma is formed, the substrate can be or is already heated to a desired processing temperature. In some embodiments, a showerhead is connected to the remote plasma source and filters out the ions so that the radicals of the reducing gas species can be flowed towards the substrate in the processing chamber.

At step 620a, the metal seed layer of the substrate is exposed to the radicals of the reducing gas species. A portion of the metal seed layer can include an oxide of the metal seed layer. Ions, radicals, and other charged species formed in the remote plasma flow through the showerhead, and ions and other charged species can be filtered out so that the substrate is substantially exposed to radicals of the reducing gas species. The metal oxide can react with the radicals of the reducing gas species or the reducing gas species itself to convert the metal oxide to metal. The reaction takes place under conditions that convert the metal oxide to metal. The metal oxide in the metal seed layer is reduced to form a film integrated with the metal seed layer. Reduction of a metal oxide in a metal seed layer using a reducing gas species can be described in U.S. application Ser. No. 13/787,499, filed Mar. 6, 2013, which is incorporated herein by reference in its entirety and for all purposes. In some embodiments, radicals of the reducing gas species flow through the showerhead when the showerhead is maintained at a temperature below about 30° C.

Figure 7C:
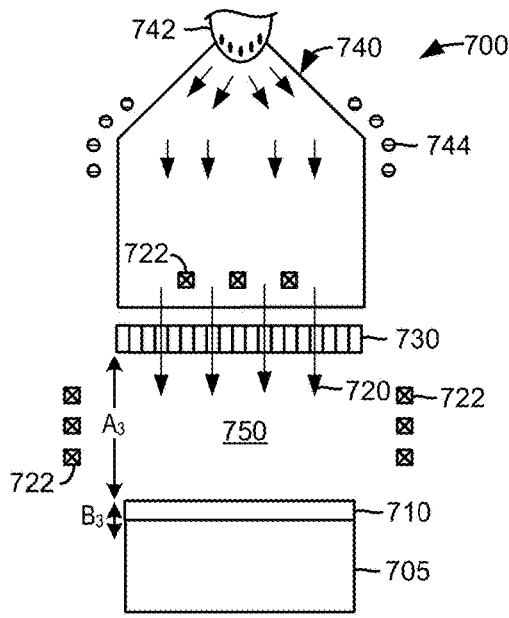

FIG. 7C shows an example of a cross-sectional schematic diagram of a remote plasma apparatus 700 at one of the stages of treating a substrate with a metal seed layer (such as at steps 615a and 620a). The remote plasma apparatus 700 includes a remote plasma source 740 over the substrate 710 and one or more coils 744 surrounding the walls of the remote plasma source 740. A gas inlet 742 can be connected to the remote plasma source 740 to deliver a reducing gas species 720 into an internal volume of the remote plasma source 740. The reducing gas species 720 can be flowed at a flow rate between about 500 sccm and about 30,000 sccm, which can be applicable to any substrate size. In some embodiments, the reducing gas species 720 can include at least one of $H_2$, $NH_3$, CO, $B_2H_6$, sulfite compounds, carbon and/or hydrocarbons, phosphites, and $N_2H_4$. Power supplied to the one or more coils 744 can generate a remote plasma of the reducing gas species 720 in the remote plasma source 740. RF plasma power supplied to the coils 744 can be between about 0.5 kW and about 6 kW. The remote plasma can include radicals of the reducing gas species 720, such as H*, NH*, $NH_2$*, or $N_2H_3$*. The remote plasma can also include ions and other charged species, but the showerhead 730 can filter them out so that the radicals of the reducing gas species 720 arrive at the substrate 710. The radicals of the reducing gas species 720 flow from the remote plasma source 740 through the showerhead 730 and onto the surface of the substrate 710 in the processing chamber 750. The showerhead 730 can be maintained at a relatively cool temperature, such as less than about 30° C. The cooled showerhead 730 can limit excess heat from reaching the substrate 710 and avoid damaging the metal seed layer in the substrate 710.

In FIG. 7C, the substrate 710 can remain in an unactuated position. A distance $A_3$ between the substrate 710 and the showerhead 730 can be adjusted by moving the substrate support 705. Adjusting the distance $A_3$ can tune the rate of reduction reaction and the uniformity of the reduction reaction occurring at the substrate 710. For example, a shorter distance $A_3$ can lead to faster conversion of metal oxide but less uniformity, while a longer distance $A_3$ can lead to slower conversion of metal oxide but greater uniformity. In some embodiments, the distance $A_3$ can be the same as the distance $A_2$. Movable members 715 can be retracted so that the substrate 710 and the substrate support 705 remain in contact, or a distance $B_3$ between the substrate 710 and the substrate support 705 can be the same as the distance $B_2$ in FIG. 7B.

The temperature of the substrate support 705 can be adjusted via an active heating or active cooling system. The temperature can be tuned according to the metal seed layer in the substrate 710 being treated. For example, the temperature of the substrate support 705 can be changed when switching between two different metal seed layers that require operating in two different temperature regimes. For example, the substrate support 705 can be heated between about 250° C. and about 300° C. for a cobalt seed layer, and switched to be between about 75° C. and about 100° C. for a copper seed layer.

Returning to FIG. 6A, at step 625a, the substrate is exposed to a cooling gas. The cooling gas can include at least one of argon, helium, and nitrogen. In some embodiments, the cooling gas can be produced by expanding a cold liquid to a gas. Exposing the substrate to the cooling gas can cool the substrate to a temperature below about 30° C. Thus, the cooling gas can be delivered at a temperature below ambient conditions to cool the substrate. In some embodiments, the substrate can be moved to an actuated position via the movable members prior to exposing the substrate to the cooling gas. The substrate can be exposed to the cooling gas while in the actuated position for faster cooling. In some embodiments, the substrate can be transferred to an electroplating apparatus after exposing the substrate to the cooling gas. Alternatively, the substrate may be transferred to an electroless plating or other metal deposition apparatus. In some embodiments, the processing chamber can be vented to atmospheric conditions with a venting gas after exposing the substrate to the cooling gas.

Figure 7D:
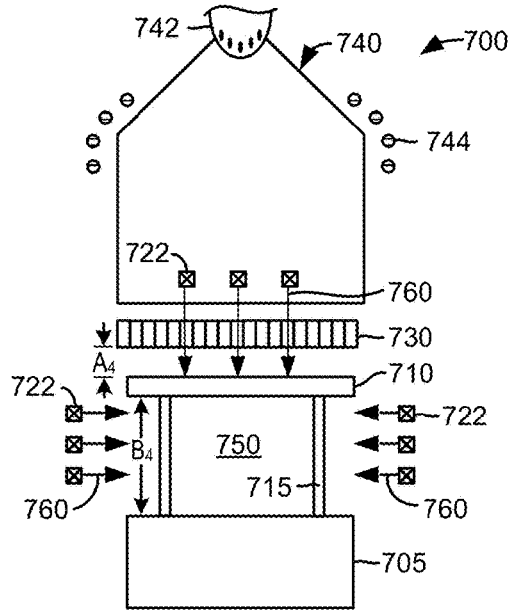

FIG. 7D shows an example of a cross-sectional schematic diagram of a remote plasma apparatus 700 at one of the stages of treating a substrate with a metal seed layer (such as at step 625a). The remote plasma apparatus 700 can include one or more cooling gas inlets 722 for delivering a cooling gas 760. The cooling gas inlets 722 may be positioned around the substrate 710, including above and to the side of the substrate 710. Cooling gas 760 can be directed onto the substrate 710 through the showerhead 730 and perpendicular to the substrate plane. Cooling gas 760 can also be directed onto the substrate 710 and parallel to the substrate plane from cooling gas inlets 722 on the sides of the process chamber 750. The cooling gas 760 can be flowed into the process chamber 750 at a flow rate between about 0.1 slm and about 100 slm. The cooling gas inlets 722 can flush cooling gas 760 across the substrate 710 to rapidly cool the substrate 710 prior to transferring the substrate to an electroplating, electroless plating, or other metal deposition apparatus. In some embodiments, the substrate 710 can be cooled without turning off or cooling the substrate support 705. This can enable the substrate 710 to be treated and cooled within a single process chamber 750 without having to use a two-chamber design having separate heating and cooling zones.

In FIG. 7D, the substrate 710 can be in an actuated position. A distance $A_4$ between the showerhead 730 and the substrate 710 can be between about 0.05 inches and about 0.75 inches. In some embodiments, the distance $A_4$ can be the same as the distance $A_1$ in FIG. 7A. By positioning the substrate 710 closer to a cooled showerhead 730 and away from a hot substrate support 705, the substrate 710 can be cooled at a faster rate. Movable members 715 can lift the substrate 710 away from the substrate support 705 and towards the showerhead 730. A distance $B_4$ between the substrate support 705 and the substrate 710 can be greater than about 1 inch, or between about 1 inch and about 5 inches. In some embodiments, the distance $B_4$ can be the same as the distance $B_1$ in FIG. 7A. In some embodiments, when the substrate 710 is in the actuated position and cooled to about room temperature, the process chamber 750 can be vented to atmospheric conditions and transferred to an electroplating, electroless plating, or other metal deposition apparatus.

Figure 6B:
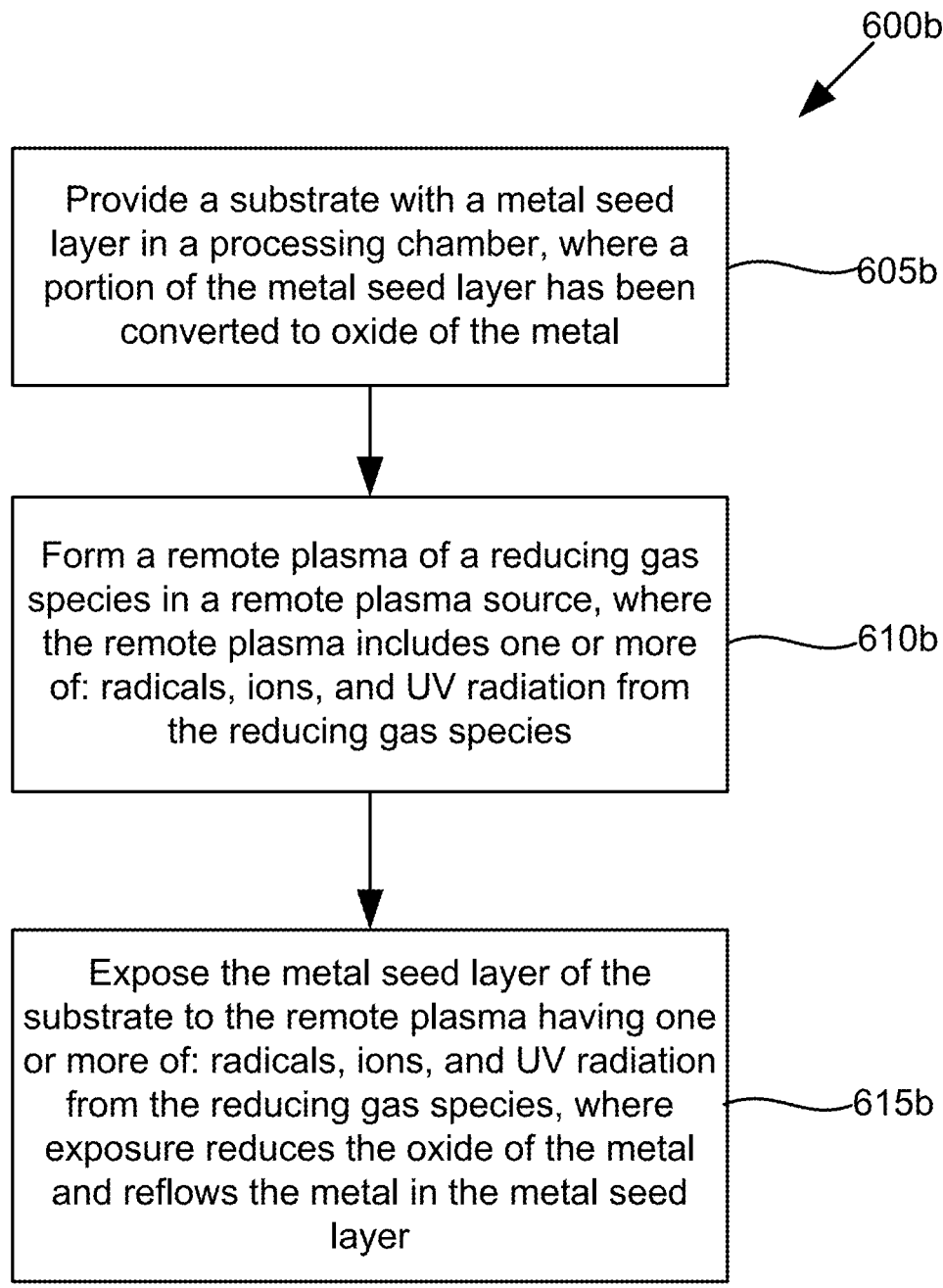
FIG. 6B shows an exemplary flow diagram illustrating another method of treating a substrate with a metal seed layer.

FIG. 6B shows an exemplary flow diagram illustrating another method of treating a substrate with a metal seed layer. At step 605b of the method 600b, a substrate with a metal seed layer can be provided in a processing chamber, as generally described at step 605a of the method 600a. The metal seed layer can have a portion that has been converted to oxide of the metal.

At step 610b, a remote plasma of a reducing gas species can be formed in a remote plasma source, where the remote plasma includes one or more of: radicals, ions, and UV radiation from the reducing gas species. The energy of the remote plasma may be increased to generate higher energy species, including higher energy ions. Higher energy ions may be produced in high density plasma (HDP) processing systems and/or sputtering systems. The remote plasma may also generate UV radiation as a result of excitation of the reducing gas species. The generated UV radiation can have a wavelength between about 100 nm and about 700 nm. For example, the generated UV radiation can include short wavelength UV light, such as between about 120 nm and about 200 nm, and long wavelength UV light, such as between about 200 nm and about 700 nm. In addition, the remote plasma may include neutrals and/or generate recombined molecules of the reducing gas species.

At step 615b, the metal seed layer of the substrate is exposed to the remote plasma, where the exposure reduces the oxide of the metal and reflows the metal in the metal seed layer. In some implementations, reflow of the metal and the reduction of the metal oxide may occur concurrently. In some implementations, the remote plasma can include radicals, ions, and UV radiation from the reducing gas species, or some combination thereof. A showerhead between the remote plasma source and the processing chamber can have a thickness, a number of holes, and an average diameter of holes configured to permit radicals, ions, and UV radiation flow or otherwise travel through the showerhead toward the substrate. The radicals, ions, and UV radiation may enter the processing chamber and reduce metal oxide in the metal seed layer. High energy ions may penetrate further from the surface of the substrate to provide a reducing chemistry throughout more of the metal seed layer. UV radiation may activate the metal oxide surface to improve the thermodynamics of the reduction process, or directly reduce the metal oxide itself. The UV radiation may also be absorbed by the reducing gas species and give rise to radicals that can reduce metal oxide. Furthermore, neutral molecules of the reducing gas species may further react and reduce metal oxide in the metal seed layer.

In some implementations, the metal in the metal seed layer may be excited and mobilized upon exposure. The metal may be reflowed to reduce gaps and voids in the metal seed layer, which can reduce the surface roughness of the metal seed layer. How much the metal is reflowed can depend on the temperature of the substrate, the chamber pressure, the reducing gas species, and the intensity of the UV radiation, for example. As the metal is reflowed and redistributed on the underlying layer, a more uniform and continuous metal seed layer can be formed.

Figure 8A:
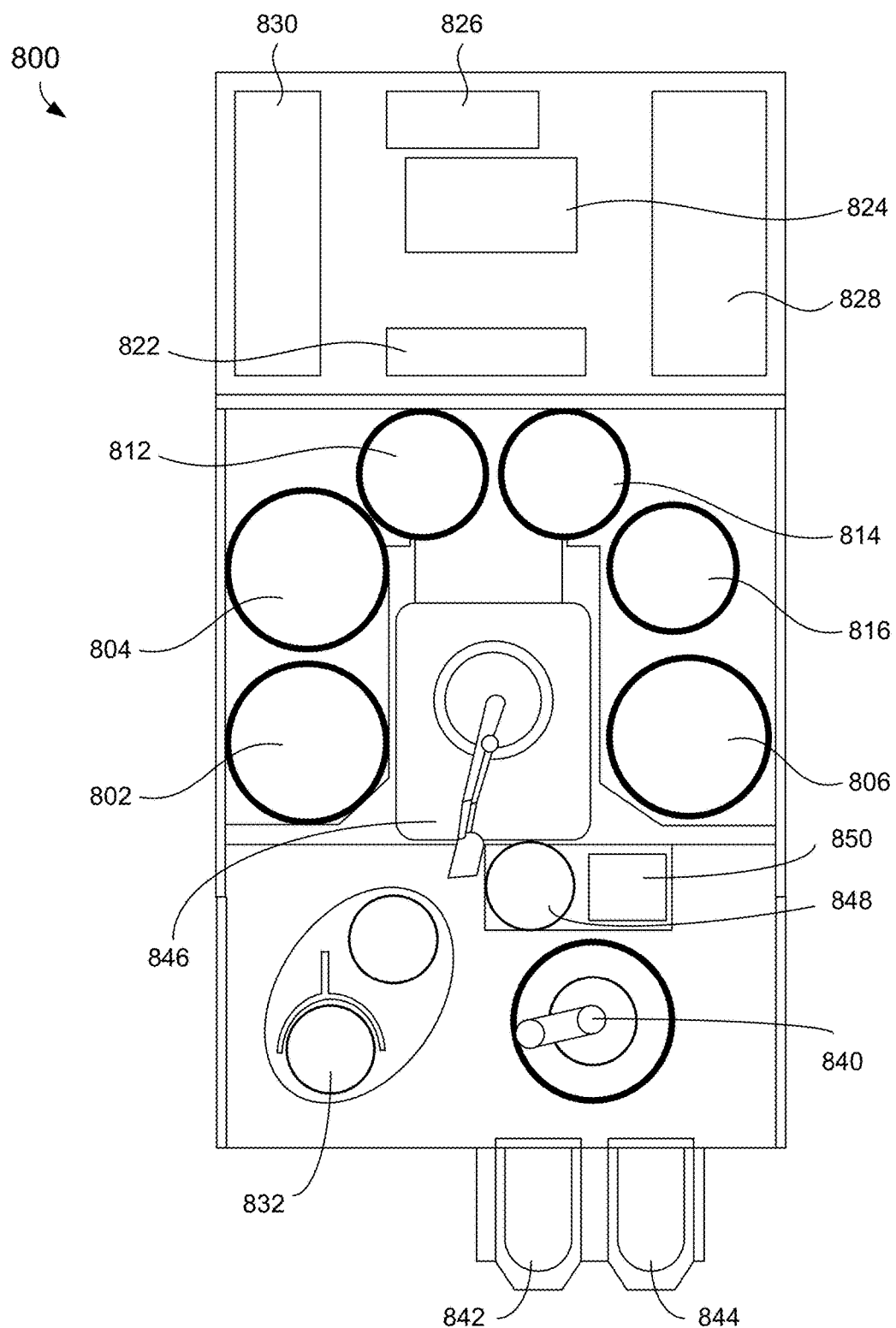
FIG. 8A shows an example of a top view schematic of an electroplating apparatus.

FIG. 8A shows an example of a top view schematic of an electroplating apparatus. The electroplating apparatus 800 can include three separate electroplating modules 802, 804, and 806. The electroplating apparatus 800 can also include three separate modules 812, 814, and 816 configured for various process operations. For example, in some embodiments, modules 812 and 816 may be spin rinse drying (SRD) modules and module 814 may be an annealing station. However, the use of SRD modules may be rendered unnecessary after exposure to a reducing gas species from a remote plasma treatment. In some embodiments, at least one of the modules 812, 814, and 816 may be post-electrofill modules (PEMs), each configured to perform a function, such as edge bevel removal, backside etching, and acid cleaning of substrates after they have been processed by one of the electroplating modules 802, 804, and 806.

The electroplating apparatus 800 can include a central electroplating chamber 824. The central electroplating chamber 824 is a chamber that holds the chemical solution used as the electroplating solution in the electroplating modules 802, 804, and 806. The electroplating apparatus 800 also includes a dosing system 826 that may store and deliver additives for the electroplating solution. A chemical dilution module 822 may store and mix chemicals that may be used as an etchant. A filtration and pumping unit 828 may filter the electroplating solution for the central electroplating chamber 824 and pump it to the electroplating modules 802, 804, and 806.

In some embodiments, an annealing station 832 may be used to anneal substrates as pretreatment. The annealing station 832 may include a number of stacked annealing devices, e.g., five stacked annealing devices. The annealing devices may be arranged in the annealing station 832 one on top of another, in separate stacks, or in other multiple device configurations.

A system controller 830 provides electronic and interface controls required to operate the electroplating apparatus 800. The system controller 830 (which may include one or more physical or logical controllers) controls some or all of the properties of the electroplating apparatus 800. The system controller 830 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 830 or they may be provided over a network. In certain embodiments, the system controller 830 executes system control software.

The system control software in the electroplating apparatus 800 may include electroplating instructions for controlling the timing, mixture of the electrolyte components, inlet pressure, plating cell pressure, plating cell temperature, substrate temperature, current and potential applied to the substrate and any other electrodes, substrate position, substrate rotation, and other parameters performed by the electroplating apparatus 800. System control software may be configured in any suitable way. For example, various process tool component sub-routines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of an electroplating process may include one or more instructions for execution by the system controller 830, and each phase of the pretreatment or reducing process may include one or more instructions for execution by the system controller 830. In electroplating, the instructions for setting process conditions for an immersion process phase may be included in a corresponding immersion recipe phase. In pretreatment or reducing, the instructions for setting process conditions for exposing the substrate to a remote plasma may be included in a corresponding reducing phase recipe. In some embodiments, the phases of electroplating and reducing processes may be sequentially arranged, so that all instructions for a process phase are executed concurrently with that process phase.

Other computer software and/or programs may be employed in some embodiments. Examples of programs or sections of programs for this purpose include a substrate positioning program, an electrolyte composition control program, a pressure control program, a heater control program, a potential/current power supply control program. Other examples of programs or sections of this program for this purpose include a timing control program, movable members positioning program, a substrate support positioning program, a remote plasma apparatus control program, a pressure control program, a substrate support temperature control program, a showerhead temperature control program, a cooling gas control program, and a gas atmosphere control program.

In some embodiments, there may be a user interface associated with the system controller 830. The user interface may include a display screen, graphical software displays of the apparatus and/or process conditions, and user input devices such as pointing devices, keyboards, touch screens, microphones, etc.

Signals for monitoring the process may be provided by analog and/or digital input connections of the system controller 830 from various process tool sensors. The signals for controlling the process may be output on the analog and digital output connections of the process tool. Non-limiting examples of process tool sensors that may be monitored include mass flow controllers, pressure sensors (such as manometers), thermocouples, etc. Appropriately programmed feedback and control algorithms may be used with data from these sensors to maintain process conditions, such as temperature of the substrate.

A hand-off tool 840 may select a substrate from a substrate cassette such as the cassette 842 or the cassette 844. The cassettes 842 or 844 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 840 may hold the substrate using a vacuum attachment or some other attaching mechanism.

The hand-off tool 840 may interface with the annealing station 832, the cassettes 842 or 844, a transfer station 850, or an aligner 848. From the transfer station 850, a hand-off tool 846 may gain access to the substrate. The transfer station 850 may be a slot or a position from and to which hand-off tools 840 and 846 may pass substrates without going through the aligner 848. In some embodiments, however, to ensure that a substrate is properly aligned on the hand-off tool 846 for precision delivery to an electroplating module, the hand-off tool 846 may align the substrate with an aligner 848. The hand-off tool 846 may also deliver a substrate to one of the electroplating modules 802, 804, or 806 or to one of the three separate modules 812, 814, and 816 configured for various process operations.

Figure 8B:
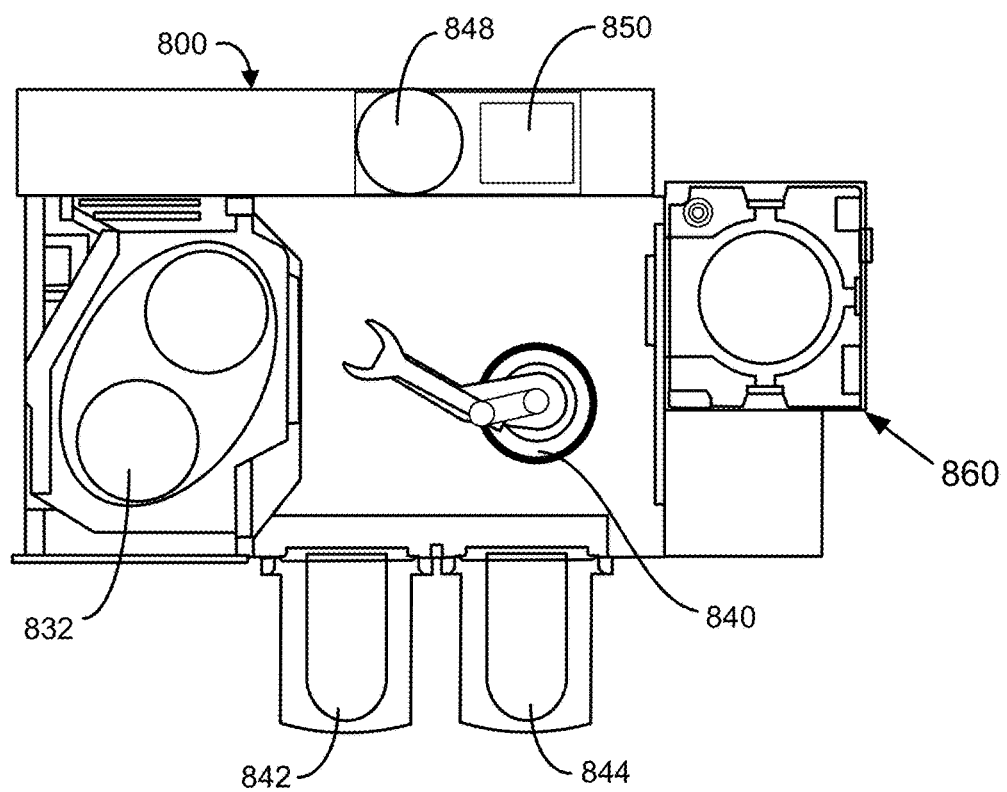
FIG. 8B shows an example of a magnified top view schematic of a remote plasma apparatus with an electroplating apparatus.
Figure 8C:
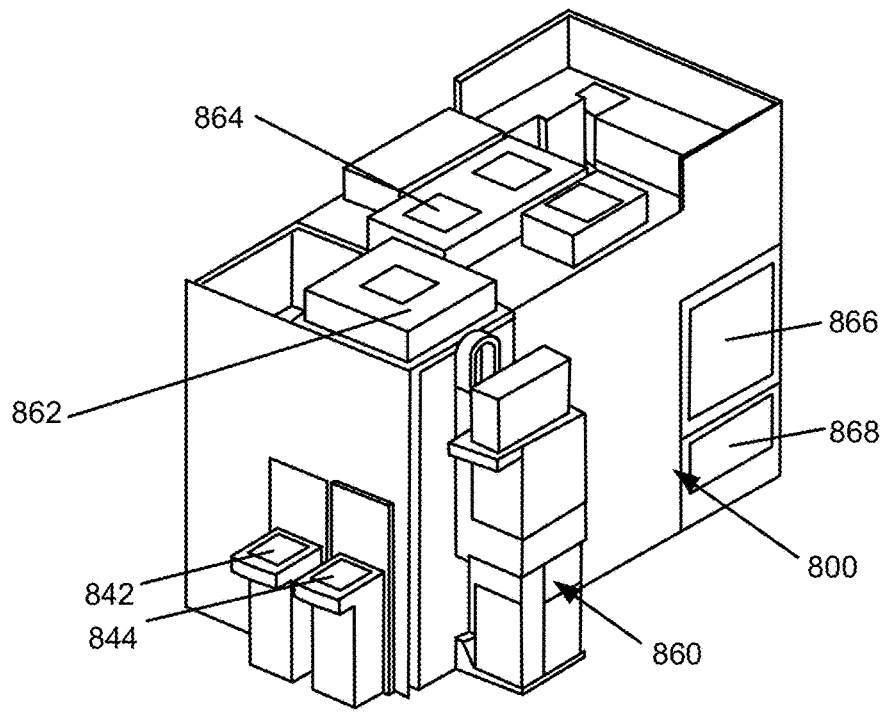
FIG. 8C shows an example of a three-dimensional perspective view of a remote plasma apparatus attached to an electroplating apparatus.

In some embodiments, a remote plasma apparatus may be part of or integrated with the electroplating apparatus 800. FIG. 8B shows an example of a magnified top view schematic of a remote plasma apparatus with an electroplating apparatus. However, it is understood by those of ordinary skill in the art that the remote plasma apparatus may alternatively be attached to an electroless plating apparatus or other metal deposition apparatus. FIG. 8C shows an example of a three-dimensional perspective view of a remote plasma apparatus attached to an electroplating apparatus. The remote plasma apparatus 860 may be attached to the side of the electroplating apparatus 800. The remote plasma apparatus 860 may be connected to the electroplating apparatus 800 in such a way so as to facilitate efficient transfer of the substrate to and from the remote plasma apparatus 860 and the electroplating apparatus 800. The hand-off 840 may gain access to the substrate from cassette 842 or 844. The hand-off tool 840 may pass the substrate to the remote plasma apparatus 860 for exposing the substrate to a remote plasma treatment and a cooling operation. The hand-off tool 840 may pass the substrate from the remote plasma apparatus 860 to the transfer station 850. In some embodiments, the aligner 848 may align the substrate prior to transfer to one of the electroplating modules 802, 804, and 806 or one of the three separate modules 812, 814, and 816.

Operations performed in the electroplating apparatus 800 may introduce exhaust that can flow through front-end exhaust 862 or a back-end exhaust 864. The electroplating apparatus 800 may also include a bath filter assembly 866 for the central electroplating station 824, and a bath and cell pumping unit 868 for the electroplating modules 802, 804, and 806.

In some embodiments, the system controller 830 may control the parameters for the process conditions in the remote plasma apparatus 860. Non-limiting examples of such parameters include substrate support temperature, showerhead temperature, substrate support position, movable members position, cooling gas flow, cooling gas temperature, process gas flow, process gas pressure, venting gas flow, venting gas, reducing gas, plasma power, and exposure time, transfer time, etc. These parameters may be provided in the form of a recipe, which may be entered utilizing the user interface as described earlier herein.

Operations in the remote plasma apparatus 860 that is part of the electroplating apparatus 800 may be controlled by a computer system. In some embodiments, the computer system is part of the system controller 830 as illustrated in FIG. 8A. In some embodiments, the computer system may include a separate system controller (not shown) including program instructions. The program instructions may include instructions to perform all of the operations needed to reduce metal oxides to metal in a metal seed layer. The program instructions may also include instructions to perform all of the operations needed to cool the substrate, position the substrate, and load/unload the substrate.

In some embodiments, a system controller may be connected to a remote plasma apparatus 860 in a manner as illustrated in FIG. 5. In one embodiment, the system controller includes instructions for providing a substrate in a processing chamber, moving the substrate towards a substrate support in the processing chamber, forming a remote plasma of a reducing gas species in a remote plasma source, where the remote plasma includes radicals of the reducing gas species, exposing a metal seed layer of the substrate to radicals of the reducing gas species, and exposing the substrate to a cooling gas. The remote plasma may include one or more of radicals, ions, neutrals, and UV radiation from the reducing gas species, resulting in the metal seed layer being exposed to one or more of radicals, ions, neutrals, and UV radiation from the reducing gas species. The system controller may further include instructions for performing operations as described earlier herein with respect to FIGS. 5, 6A, 6B, and 7A-7D.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

Examples

Figure 9:
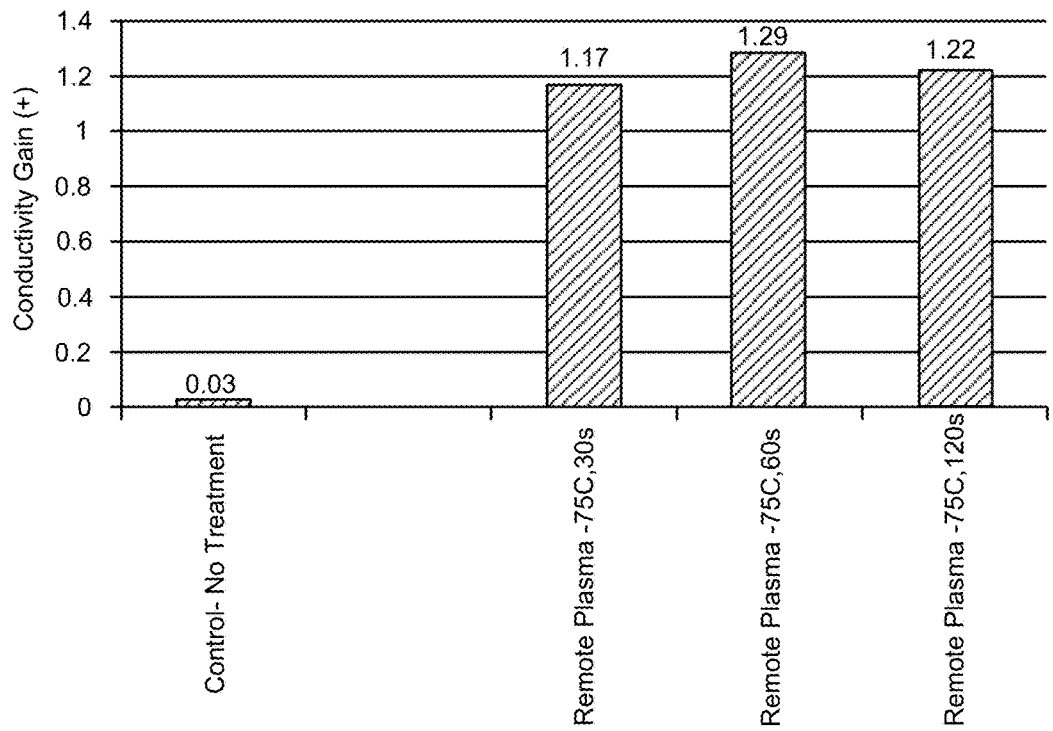
FIG. 9 shows a graph illustrating the effects of exposure to a remote plasma and gains in electrical conductivity for copper.

FIG. 9 shows a graph illustrating the effects of exposure to a remote plasma and gains in electrical conductivity for copper. Without pretreating the substrate including a copper seed layer with a remote plasma, the change in electrical conductivity at the surface of the copper is almost negligible. However, treating the substrate heated to 75° C. with a remote plasma substantially increases the electrical conductivity at the surface of the copper seed layer. The effects remained largely the same whether the remote plasma treatment occurred from 30 seconds, 60 seconds, and 120 seconds. Therefore, pretreatment with a remote plasma effectively reduces the presence of copper oxide to pure metallic copper to increase the electrical conductivity.

Figure 10:
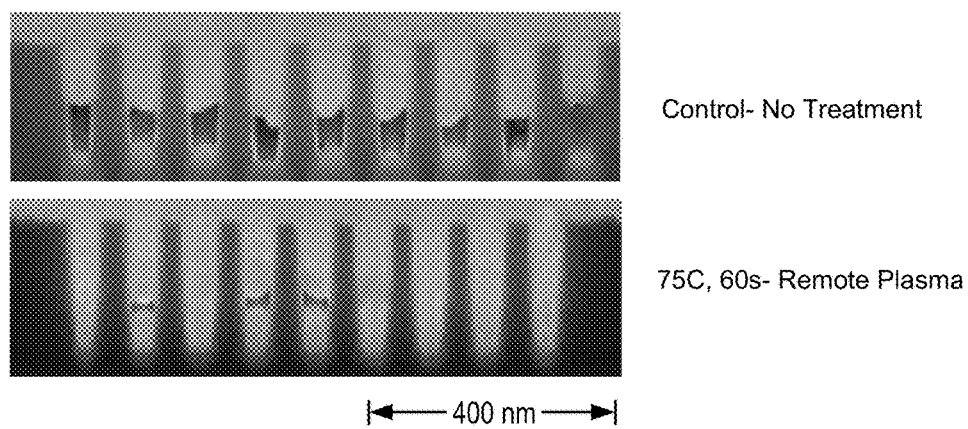
FIG. 10 shows scanning electron microscopy (SEM) images of seed trench coupons when treated using a remote plasma and when not treated using a remote plasma.

FIG. 10 shows scanning electron microscopy (SEM) images of seed trench coupons when treated using a remote plasma and when not treated using a remote plasma. Samples of copper seeded trench coupons were exposed to a remote plasma to determine the effectiveness of the remote plasma in reducing copper oxide and avoiding void formation. Each of the samples of the copper seeded trench coupons had trenches with a width of about 48 nm each. Marginal copper seeded trench coupons were utilized where the seed condition provided thin seed coverage. The marginal copper seeded trench coupons generally result in very large bottom voids. The marginal copper seeded trench coupons represent extreme samples that are typically not found on production wafers, but can more effectively indicate the ability of reducing agent treatment in reducing copper oxide and preventing void formation.

In FIG. 10, the marginal copper seeded trench coupons were plated with copper without pretreatment by exposure to a remote plasma. The trench coupons resulted in poor fill and substantially large bottom void sizes. However, the trench coupons pretreated by exposure to a remote plasma for 60 seconds at 75° C. prior to electroplating with copper resulted in trench coupons with better fill and smaller bottom voids. Therefore, the SEM images of the trench coupons reveal the improved fill of electroplating following pretreatment with a remote plasma.

Figure 11:
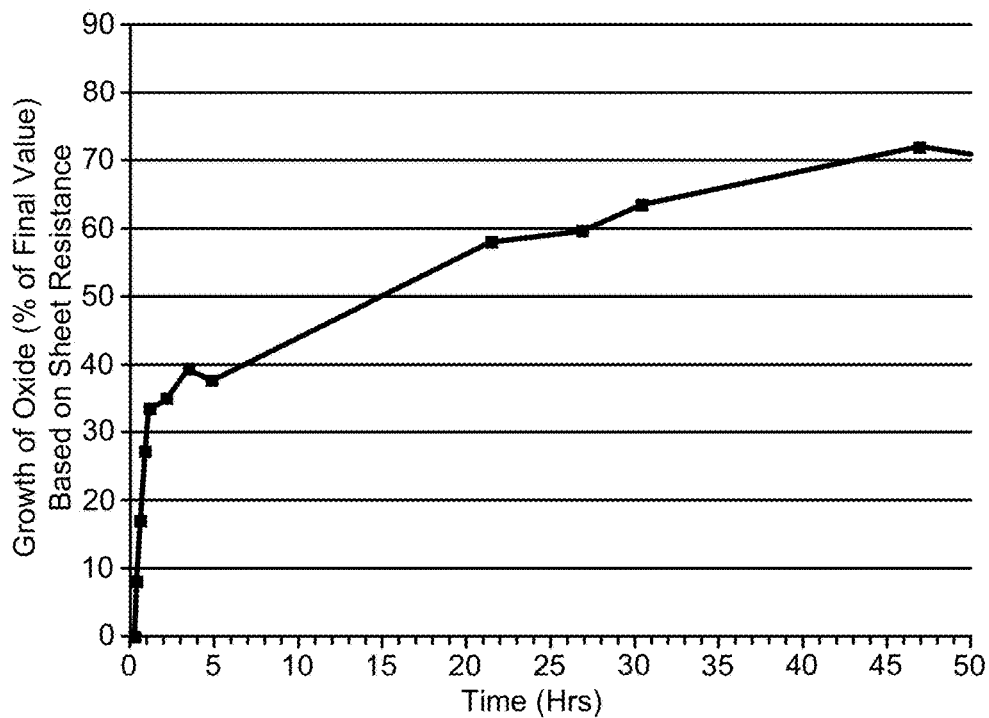
FIG. 11 shows a graph illustrating the growth of metal oxide on a metal seed layer exposed to ambient conditions following a reduction treatment.

FIG. 11 shows a graph illustrating the growth of metal oxide on a metal seed layer exposed to ambient conditions following a reduction treatment. After a metal seed layer is pretreated with a remote plasma, exposure to ambient conditions can lead to regrowth of metal oxide. The graph in FIG. 11 shows that regrowth of metal oxide occurs rapidly as a function of time. Within the first four hours, the surface of the metal seed layer can substantially reoxidize. Therefore, reducing the duration of exposure to ambient conditions can substantially limit the reoxidation of metal oxide.

Figure 12:
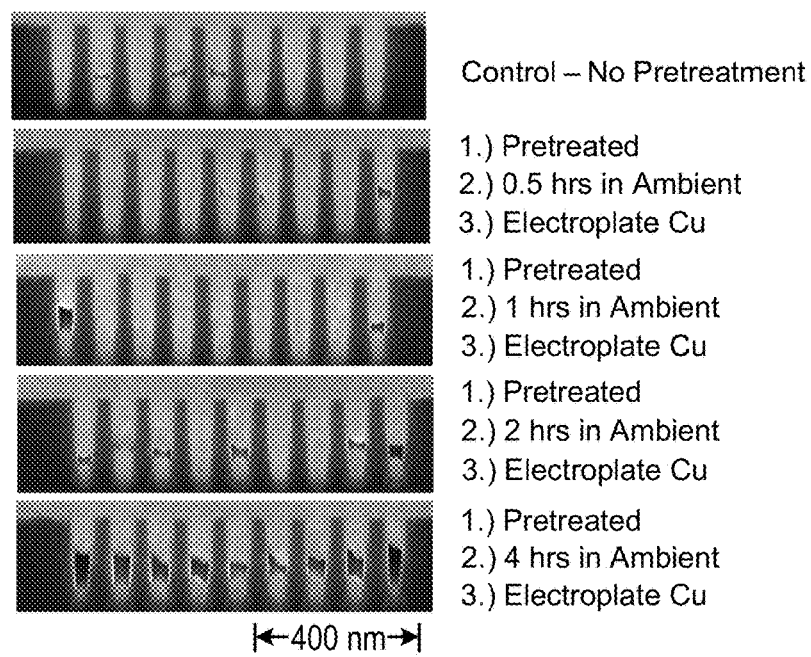
FIG. 12 shows SEM images of seed trench coupons exposed to ambient conditions for different durations following a reduction treatment and when not following a reduction treatment.

FIG. 12 shows SEM images of seed trench coupons exposed to ambient conditions for different durations following a reduction treatment and when not following a reduction treatment. The first control condition plated copper without any pretreatment. The second through last conditions plated copper in trench coupons that were pretreated with a remote plasma, where each of the conditions were exposed to ambient conditions for different amounts of time. The trench coupons under the second condition displayed the best fill and the smallest bottom voids. The second condition pretreated the trench coupons with a remote plasma and was exposed to ambient conditions for the shortest duration of time. Therefore, the SEM images reveal that reducing the duration of the transfer time following pretreatment with a remote plasma substantially improves the fill of electroplating.

Figure 13:
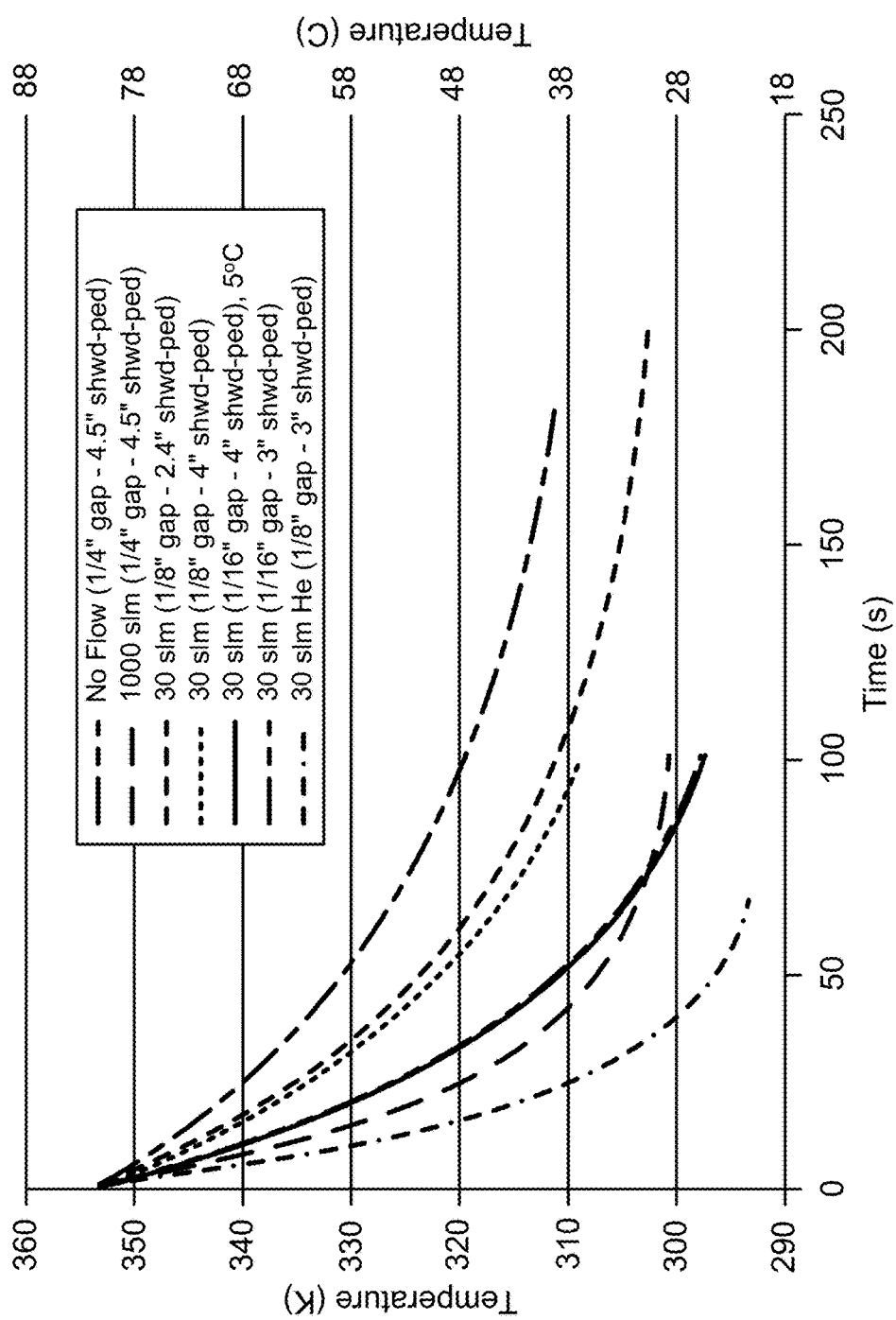
FIG. 13 shows a graph illustrating temperature cooling profiles over time under different conditions in a processing chamber.

FIG. 13 shows a graph illustrating temperature cooling profiles over time under different conditions in a processing chamber. Each of the cooling profiles were obtained by cooling a substrate from about 85° C. under various flow rates of cooling gas, distance between the showerhead and the substrate, and distance between the showerhead and the pedestal. Rapid cooling rates can be achieved by adjusting the aforementioned parameters. For example, a substrate can rapidly cool in about 1 minute from about 85° C. to about room temperature by delivering helium at 30 slm, positioning the substrate at ⅛ inches from the showerhead, and positioning the pedestal 3 inches from the showerhead.

Figure 14:
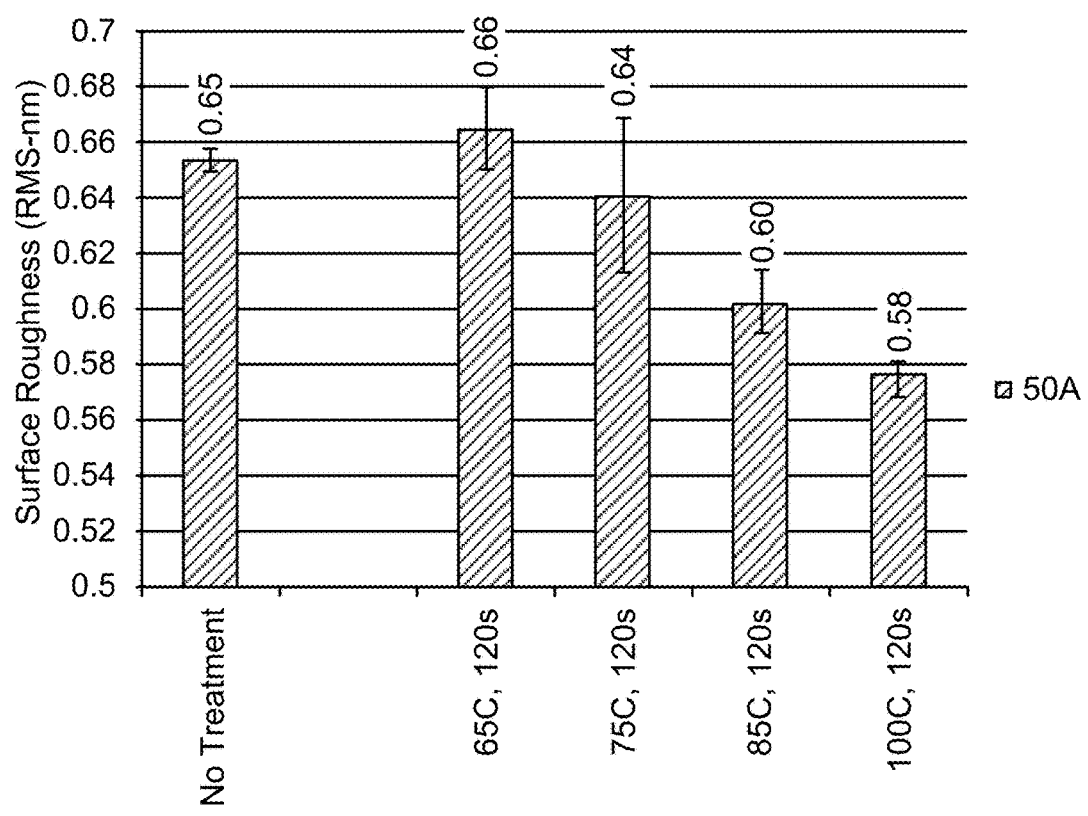
FIG. 14 shows a graph illustrating the effects of temperature and surface roughness of the metal seed layer following a remote plasma treatment.

FIG. 14 shows a graph illustrating the effects of temperature and surface roughness of the metal seed layer following a remote plasma treatment. As temperatures of the substrates increased from about 65° C. to about 100° C., the average surface roughness of a 50 Å thick metal seed layer decreased from 0.66 nm root mean square (RMS) to about 0.58 nm RMS. Thus, the graph in FIG. 14 shows a correlation between increasing temperature and a smoother metal seed layer. This indicates that metal seed reflow from the increased temperature may lead to a more uniform and continuous metal seed layer.

Figure 15:
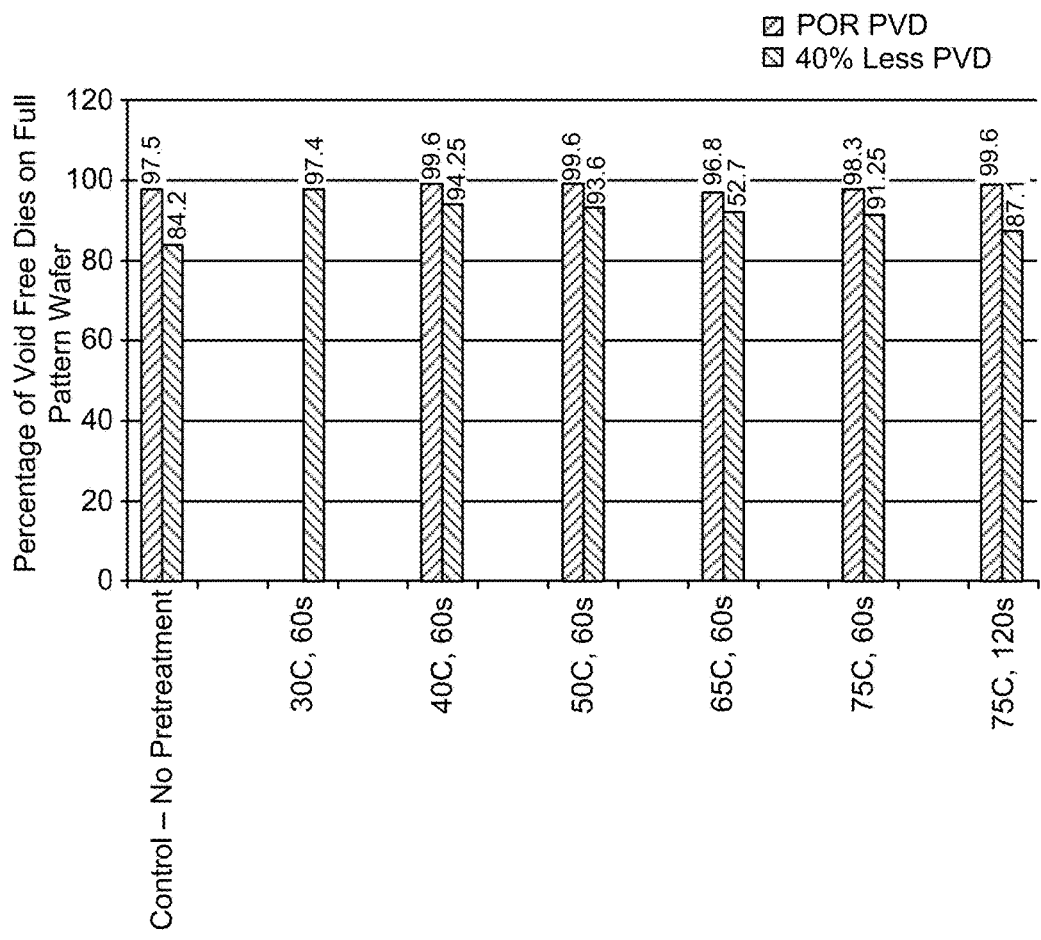
FIG. 15 shows a graph illustrating the effects of temperature and void reduction in a metal seed layer.

FIG. 15 shows a graph illustrating the effects of temperature and void reduction in a metal seed layer. For some seed layers, such as copper seed layers, lower substrate temperatures can reduce the percentage of voids on the substrate.

Other Embodiments

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A remote plasma apparatus for treating a substrate with a metal seed layer, the remote plasma apparatus comprising:
a processing chamber;
a substrate support for holding the substrate in the processing chamber, wherein a portion of the metal seed layer of the substrate has been converted to oxide of the metal;
one or more cooling gas inlets above the substrate support in the processing chamber;
a remote plasma source over the substrate support;
a reducing gas inlet connected to the remote plasma source;
a showerhead between the remote plasma source and the substrate support, wherein the one or more cooling gas inlets are positioned to provide cooling gas through the showerhead and/or provide cooling gas from an area peripheral to the substrate between the showerhead and the substrate support; and
a controller configured with instructions for performing the following operations:
    forming a remote plasma of a reducing gas species in the remote plasma source, wherein the remote plasma comprises one or more of: radicals of the reducing gas species, ions of the reducing gas species, and ultraviolet (UV) radiation generated from excitation of the reducing gas species;
    exposing the metal seed layer of the substrate to the remote plasma in the processing chamber under conditions that reduce the oxide of the metal and reflows the metal in the metal seed layer; and
    flowing a cooling gas in the processing chamber from the one or more cooling gas inlets to cool the substrate after completion of exposing the metal seed layer to the remote plasma, the remote plasma apparatus being configured to cool the substrate to a temperature of about 30° C. in a span between about 40 seconds and about 100 seconds when flowing the cooling gas after completion of exposing the metal seed layer to the remote plasma.

2. The apparatus of claim 1, wherein the wavelength of the UV radiation generated from excitation of the reducing gas species is between about 100 nm and about 700 nm.

3. The apparatus of claim 1, wherein the remote plasma comprises radicals of the reducing gas species, ions of the reducing gas species, and UV radiation generated from excitation of the reducing gas species.

4. The apparatus of claim 3, wherein the remote plasma further comprises neutral molecules of the reducing gas species, and wherein exposing the metal seed layer to the remote plasma further comprises exposing the metal seed layer to neutral molecules of the reducing gas species.

5. The apparatus of claim 1, wherein the showerhead comprises a plurality of holes, the number of holes in the showerhead being between about 100 and about 900 holes.

6. The apparatus of claim 1, wherein the showerhead comprises a plurality of holes, the average diameter of the holes being between about 0.05 and about 0.5 inches.

7. The apparatus of claim 1, wherein the showerhead has a thickness between about 0.25 and about 3.0 inches.

8. The apparatus of claim 1, wherein exposing the metal seed layer to the remote plasma reduces a surface roughness of the metal seed layer.

9. The apparatus of claim 1, wherein the remote plasma apparatus is part of an electroplating or electroless plating system.

10. The apparatus of claim 9, wherein the controller is further configured with instructions for transferring the substrate to a plating bath containing a plating solution in the electroplating or electroless plating system from the remote plasma apparatus.

11. The apparatus of claim 1, further comprising one or more movable members in the processing chamber configured to move the substrate away from the substrate support to positions between the showerhead and the substrate support, wherein the controller is further configured with instructions for moving the substrate towards the substrate support via the one or more movable members before exposing the substrate to the cooling gas.

12. The apparatus of claim 1, wherein the controller is further configured with instructions for heating the substrate support to a processing temperature during the operations of forming the remote plasma and exposing the metal seed layer to the remote plasma, wherein the processing temperature is between about 0° C. and about 400° C.

13. The apparatus of claim 1, wherein the metal seed layer includes at least one of copper, cobalt, ruthenium, palladium, rhodium, iridium, osmium, nickel, gold, silver, aluminum, and tungsten.

14. The apparatus of claim 1, further comprising:
a UV source, wherein the controller is further configured with instructions for exposing reducing gas species to UV radiation from the UV source to form radicals of the reducing gas species.

15. The apparatus of claim 1, further comprising:
a power source configured to bias the substrate support, wherein the controller is further configured with instructions for applying a charged bias on the substrate support.

16. The apparatus of claim 1, wherein the controller is further configured with instructions for maintaining a temperature of the showerhead at a temperature below about 30° C. during exposure to the remote plasma and during flowing the cooling gas.

17. The apparatus of claim 16, further comprising one or more movable members in the processing chamber configured to move the substrate away from the substrate support to positions between the showerhead and the substrate support, wherein the controller is further configured with instructions for moving the substrate towards the showerhead to further cool the substrate during flowing the cooling gas.

18. The apparatus of claim 1, wherein the one or more cooling gas inlets are configured to flow the cooling gas in a direction substantially perpendicular to the substrate to cool the substrate.

19. A remote plasma apparatus comprising:
a processing chamber;
a substrate support for holding a substrate with a metal seed layer in the processing chamber, wherein a portion of the metal seed layer of the substrate has been converted to oxide of the metal;
a remote plasma source over the substrate support;
a reducing gas inlet connected to the remote plasma source;
a showerhead between the remote plasma source and the substrate support;
one or more movable members in the processing chamber configured to move the substrate away from the substrate support to positions between the showerhead and the substrate support; and
a controller configured with instructions for performing the following operations:
forming a remote plasma of a reducing gas species in the remote plasma source, wherein the remote plasma comprises one or more of: radicals of the reducing gas species, ions of the reducing gas species, and ultraviolet (UV) radiation generated from excitation of the reducing gas species;
exposing the metal seed layer of the substrate to the remote plasma in the processing chamber under conditions that reduce the oxide of the metal and reflows the metal in the metal seed layer; and
moving the substrate away from the substrate support and towards the showerhead to position the substrate closer to the showerhead during exposure to the remote plasma, wherein the showerhead is actively cooled to a temperature below about 30° C. during exposure to the remote plasma so that a temperature of the substrate can be lower when closer to the actively cooled showerhead than when further from the actively cooled showerhead.

* * * * *